(12) United States Patent
Joannopoulos et al.

(10) Patent No.: US 12,381,368 B2
(45) Date of Patent: Aug. 5, 2025

(54) METHODS AND APPARATUS FOR GENERATING COHERENT LIGHT AT NEW FREQUENCIES VIA TIME VARYING LASING

(71) Applicant: Massachusetts Institute of Technology, Cambridge, MA (US)

(72) Inventors: John D. Joannopoulos, Belmont, MA (US); Marin Soljacic, Belmont, MA (US); Nicholas H. Rivera, Somerville, MA (US); Jamison M. Sloan, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 18/845,799

(22) PCT Filed: Feb. 22, 2023

(86) PCT No.: PCT/US2023/013589
§ 371 (c)(1),
(2) Date: Sep. 10, 2024

(87) PCT Pub. No.: WO2023/211556
PCT Pub. Date: Nov. 2, 2023

(65) Prior Publication Data
US 2025/0112435 A1    Apr. 3, 2025

Related U.S. Application Data

(60) Provisional application No. 63/334,943, filed on Apr. 26, 2022.

(51) Int. Cl.
*H01S 3/094* (2006.01)
*H01S 3/09* (2006.01)
*H01S 3/16* (2006.01)

(52) U.S. Cl.
CPC .......... *H01S 3/094076* (2013.01); *H01S 3/09* (2013.01); *H01S 3/16* (2013.01)

(58) Field of Classification Search
CPC ......... H01S 3/094076; H01S 3/09; H01S 3/16
See application file for complete search history.

(56) References Cited

U.S. PATENT DOCUMENTS

| | | | |
|---|---|---|---|
| 6,028,873 | A | 2/2000 | Yamamoto et al. |
| 10,079,469 | B1 | 9/2018 | Litvin et al. |

(Continued)

OTHER PUBLICATIONS

J. Stehlik, Y.-Y. Liu, C. Eichler, T. Hartke, X. Mi, M. Gullans, et al., "Double quantum dot floquet gain medium", Phys. Rev. X, vol. 6, pp. 041027, 2016 (Year: 2016).*

(Continued)

*Primary Examiner* — Yuanda Zhang
(74) *Attorney, Agent, or Firm* — Nields, Lemack & Frame, LLC

(57) ABSTRACT

A time varying laser which can operate by taking advantage of transitions between time varying quasi-energy levels which are present in the driven system is disclosed. This can allow for laser operation at frequencies which are new, compared to the operation of the laser in absence of time-modulation. It can also allow for a novel mode of operation in which the system provides gain at multiple frequencies simultaneously, in a coherent fashion which is fundamentally different from multi-mode behavior in conventional lasers. Additionally, in systems with sufficiently strong modulation, these principles can lead to lasers which produce gain even in the thermodynamic ground state of the system, leading to a new form of lasing without inversion (LWI). In addition, these techniques have the potential to be used to create lasers at high frequencies (UV-Xray) which have been difficult to achieve via conventional laser mechanisms.

23 Claims, 16 Drawing Sheets

(56) References Cited

U.S. PATENT DOCUMENTS

| | | |
|---|---|---|
| 2006/0146893 A1 | 7/2006 | Belyanin et al. |
| 2015/0226665 A1* | 8/2015 | Weidmann ............... G01J 3/42 |
| | | 356/437 |
| 2017/0194759 A1 | 7/2017 | Ammann et al. |
| 2019/0222001 A1 | 7/2019 | Adachi et al. |

OTHER PUBLICATIONS

International Search Report and Written Opinion mailed Oct. 19, 2023 in corresponding PCT application No. PCT/US2023/013589.

* cited by examiner

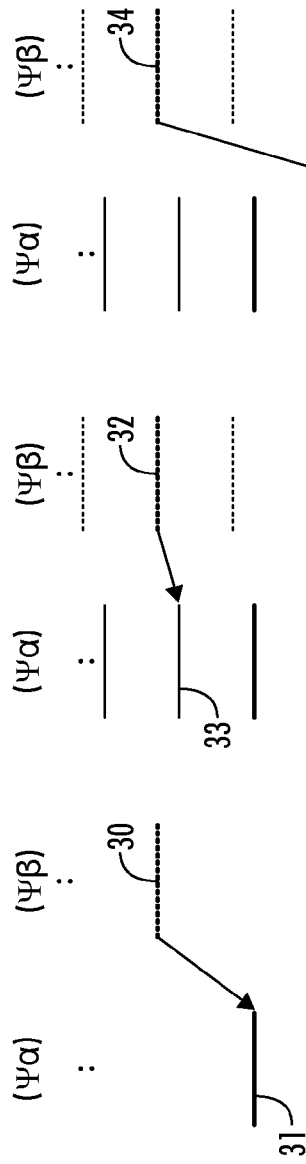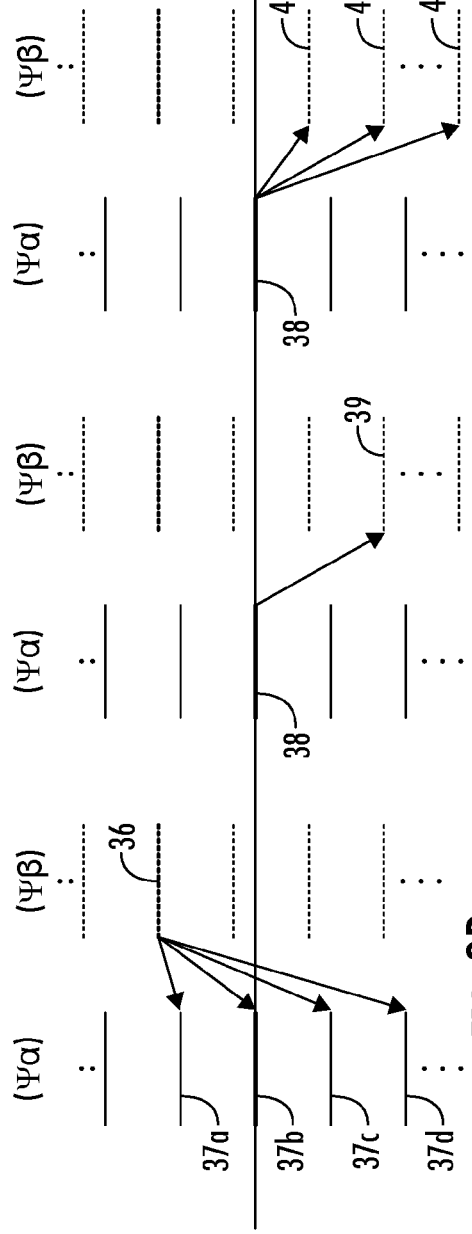

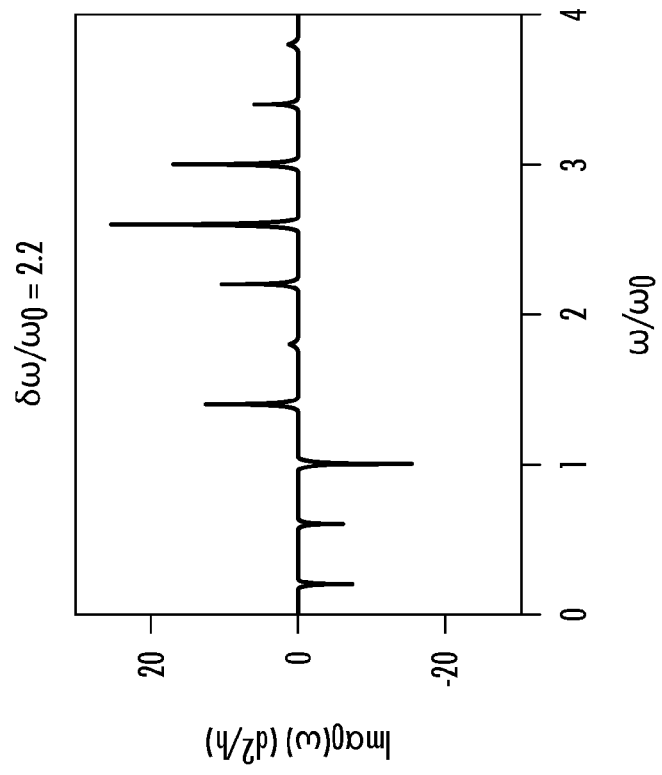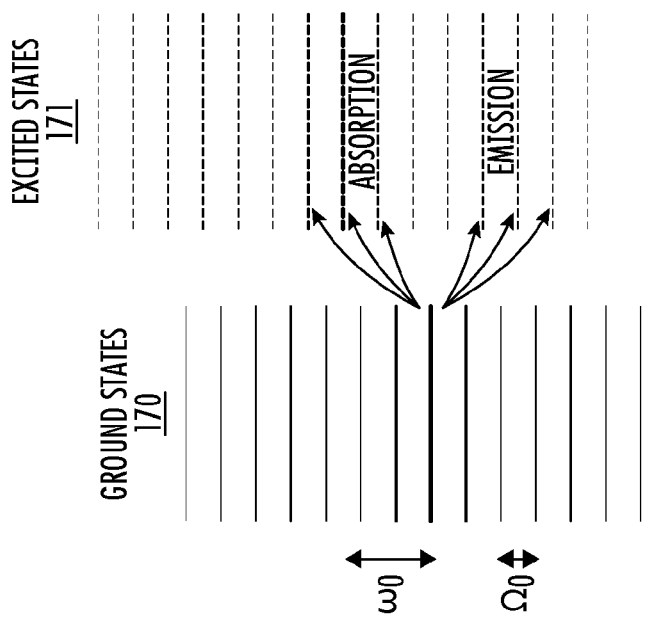
FIG. 17

METHODS AND APPARATUS FOR GENERATING COHERENT LIGHT AT NEW FREQUENCIES VIA TIME VARYING LASING

This application claims priority from U.S. Provisional Patent Application Ser. No. 63/334,943, filed Apr. 26, 2022, the disclosure of which is incorporated herein by reference in its entirety.

This invention was made with government support under FA9550-20-1-0115 awarded by the Air Force Office of Scientific Research, HR00112090081 awarded by the Defense Advanced Research Projects Agency, and under W911NF-18-2-0048 awarded by the U.S. Army Research Office. The government has certain rights in the invention.

BACKGROUND

Lasers are largely considered one of the most important scientific and technological developments of the past century, due to their ability to generate intense and monochromatic radiation. Since their inception, there have been a large number of further developments in functionality, including mode and frequency locking, intense pulsed lasers, integration into electrically pumped semiconductor platforms, and more.

The fundamental principle which is common among all existing lasers and masers is that they operate on a basis of stimulated emission transitions between an upper and lower energy state of the gain medium. In solid state gain media (such as Nd:YAG), the levels are energy levels of the Nd dopants. In a semiconductor laser, these energy levels are states in the conduction and valence band which are separated by a band gap. A feature of stationary materials (i.e., those which are not varied in time) is that they will always possess the same energy level structure, and corresponding electronic and optical properties. As a result, a stationary laser gain medium can usually only be used at one or a few frequencies (or a range of frequencies, such as in a semiconductor laser, or Ti:Sapphire gain medium). Moreover, it has been historically difficult to find suitable gain media for certain low or high frequencies, such as those in the THz or UV through X-ray ranges.

An interesting development over the past few decades has been in systems of matter which are modulated in time. When the modulation is periodic in time, such systems are broadly referred to as "Floquet" systems. Since systems which have an external time modulation no longer possess time-translation symmetry, they can exhibit useful properties that are related to the fact that they no longer have to conserve energy internally, since they have a form of energy exchange with the outside environment.

In spite of this, there is still untapped potential for the development of lasers which produce outputs at new frequencies, and lasers which exhibit novel properties in their emitted light. Therefore, it would be beneficial if there was a system and method that was able to create gain media which can operate at new frequencies, or potentially more than one frequency.

SUMMARY

A time varying laser which can operate by taking advantage of transitions between these new time varying quasi-energy levels is disclosed. This can allow for laser operation at frequencies which are new, compared to the operation of the laser in absence of time-modulation. It can also allow for a novel mode of operation in which the system provides gain at multiple frequencies simultaneously, in a coherent fashion which is fundamentally different from multi-mode behavior in conventional lasers. Additionally, in systems with sufficiently strong modulation, these principles can lead to lasers which produce gain even in the thermodynamic ground state of the system, leading to a new form of lasing without inversion (LWI). These concepts can be applied to generate gain media at frequencies where laser gain has been historically difficult to achieve, such as at EUV or X-ray frequencies. These concepts may also be applied to create lasers which operate at multiple frequencies simultaneously which can be useful for generating new frequency combs and ultrashort pulses, and also to create lasers which have tunable operation frequency depending on the type of modulation which is applied.

According to one embodiment, a laser is disclosed. The laser comprises a cavity; a gain medium disposed within the cavity; and a time varying field applied to the gain medium to transform the gain medium into a time varying gain medium; wherein the time varying field has a modulation frequency ($\Omega_0$) and a strength at the modulation frequency ($\delta\omega$), wherein a fractional modulation parameter (n) is defined as $\delta\omega/\Omega_0$.

In some embodiments, the gain medium comprises a solid state gain medium. In some embodiments, the gain medium comprises one or more gasses. In some embodiments, the gain medium comprises a metal, an insulator, or a semiconductor. In some embodiments, the gain medium comprises a spin system. In some embodiments, the gain medium comprises a qubit or a superconducting circuit. In some embodiments, the gain medium comprises a free electron/ion system.

In some embodiments, $\eta$ is less than 0.1. In some embodiments, $0.1 \leq \eta < 1$. In some embodiments, $\eta$ is greater than 1.

In some embodiments, the time varying field comprises an RF field. In some embodiments, the time varying field comprises a pulsed laser. In some embodiments, the time varying field comprises a continuous wave monochromatic or multichromatic IR/optical laser field. In some embodiments, the time varying field comprises an electric field. In some embodiments, the time varying field is periodic.

In some embodiments, the laser operates in an inversionless configuration, such that a pump source is not utilized. In some embodiments, the laser operates in an inversion configuration, and further comprising a pump source to create an inversion.

In certain embodiments, the time varying gain medium is a gas-based gain medium and the pump source comprises electrical discharge. In certain embodiments, the time varying gain medium is a solid state gain medium and the pump source comprises flashlamp discharge or a second laser. In certain embodiments, the time varying gain medium is a semiconductor gain medium and the pump source comprises an external current source.

In some embodiments, the laser operates at microwave frequencies and wherein cavity comprises a closed or partially closed metallic structure. In some embodiments, the laser operates at optical or infrared frequencies and the wherein the cavity comprises two or more mirrors. In some embodiments, the laser operates at UV or X-ray frequencies and wherein the cavity comprises structures based on Bragg reflection.

BRIEF DESCRIPTION OF THE DRAWINGS

For a better understanding of the present disclosure, reference is made to the accompanying drawings, in which like elements are referenced with like numerals, and in which:

FIG. 3A-3F show level diagrams for different Floquet laser configurations;

FIGS. 17-18 show inversionless operation.

DETAILED DESCRIPTION

Figure 1:
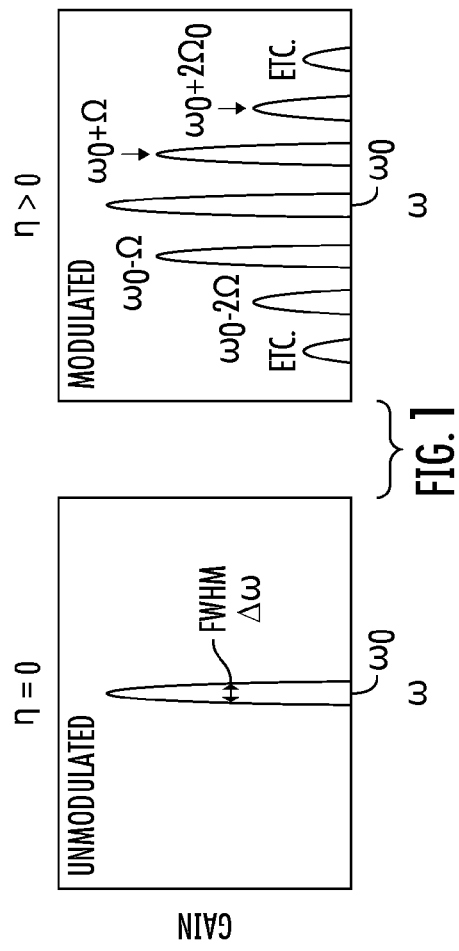
FIG. 1 shows the gain spectrum of unmodulated vs. modulated gain medium.

Mechanisms through which time-driven systems can be used to generate several different classes of "time varying lasers" are disclosed. These time varying lasers operate on the basis of stimulated emission in time-dependent systems, and can lead to laser operation at new frequencies. Systems in which the time driven system is periodic in nature may be referred to as Floquet lasers. The gain media for these systems may be referred to as Floquet gain medium. Throughout this disclosure, the term "Floquet laser" may be used. However, it is understood that other systems, which are non-periodic in nature, may also be implemented using the techniques described herein. Examples of non-periodic modulation may include a train of pulses and/or and multiple driving frequencies.

By driving some system strongly in time, a time varying gain medium may be created which is able to provide gain at new, and potentially multiple frequencies, compared to those of the undriven system.

These statements are based on the fact that time varying systems can exhibit behaviors which can be described in terms of "quasi-energy" levels which lie in an extended Hilbert space. These quasi-levels are spaced out by integer multiples of the periodic driving frequency. In a time varying laser system, the time varying gain medium is able to make stimulated emission transitions between quasi-energy levels, so that gain can be provided not only at the undriven energy difference, but also frequencies which are offset by an integer in either the positive and negative direction. Thus, a time varying gain medium can provide gain at frequencies which are both higher and lower than those provided by the undriven system. Moreover, the new frequencies of gain which can be potentially created are determined by the frequency of the periodic drive which is applied to create the time varying gain medium. Thus, by controlling the external driving frequency, one can change the gain frequencies.

Examples of gain media which may be based on time-modulated systems may include, but are not limited to:

Time-Modulated solid state gain media
Time-Modulated gasses.
Time-Modulated metals, insulators, or semiconductors
Time-Modulated spin systems.
Time-Modulated qubits/superconducting circuits.
Time-Modulated free electron/ion systems
Time-Modulated quantum wells
Time-Modulated molecular dyes Methods of time modulation may be achieved by various means, including but not limited to, electrical modulation, mechanical modulation, or driving with external laser fields. Additionally, as stated above, while the disclosure describes some gain media which are periodic in time (referred to as "Floquet gain media"), this is not strictly necessary, and in principle, gain media can also be constructed from time modulated systems which are not periodic in time.

Just as typical lasers can take many physical forms, so too can Floquet lasers. For this reason, the description of a Floquet laser is provided in general terms. The Hamiltonian of a general Floquet laser will take the form:

$$H(t) = H_0(t) + H_{EM} + V_{int}$$

Here, $H_0$ (t) is the Hamiltonian of the "matter" part of the system (i.e., the laser gain medium).

To generate a Floquet gain medium, it is assumed that the matter Hamiltonian is periodic in time with period T (i.e., $H_0(t+T)=H_0(t)$). The period is related to the driving frequency, Ω, as Ω=2π/T. It is also assumed that the electromagnetic part of the Hamiltonian includes some discrete or continuous set of electromagnetic field modes at frequencies $ω_k$, where k is a label for the mode. In this case, the electromagnetic Hamiltonian can be written as $H_{EM}=\Sigma_k ω_k α_k^\dagger α_k$ where $α_k^\dagger$ is the creation operator for mode k. Finally, it is assumed that the interaction between the light and matter take the form $V_{int}=-\mu E$, where $-\mu$ is the dipole operator associated with the matter system, and E is the total quantized electric operator field associated with the electromagnetic system. In many cases, the interaction Hamiltonian may be written in the general form $V_{int}=\Sigma_k η_k \mu(α_k+α_k^\dagger)$, where $η_k$ are coupling coefficients.

Consider a strongly driven matter system which is weakly coupled to a single cavity mode at frequency $ω_c$. The goal is to see how a strong Floquet drive can enable the gain medium to interact with a cavity which is at frequencies which are different from (and potentially higher than) the natural transition energies present in the undriven system. A general Hamiltonian may be expressed as:

$$H(t) = H_0(t) + ωα^\dagger α + gσ_x(α_k + α_k^\dagger)$$

where $H_0$ (t) is a periodic Hamiltonian as described by the Floquet theory outlined above, g is the coupling coefficient and ω is the frequency of the resonator. For the current purposes, assume that the gain medium is a two level system, so that the gain-photon interaction is given by the $\sigma_x$ Pauli matrix term above. The coupling g is assumed to be weak.

Progress can be made by taking advantage of the fact that the dynamics of $H_0(t)$ in terms of its Floquet states are known. It is also known how the cavity operators evolve. The strategy then is to rotate into the interaction picture of the time dependent system. The cavity operators transform in the usual way as:

$$(a + a^\dagger) \rightarrow (ae^{-i\omega_c t} + a^\dagger e^{i\omega_c t}).$$

In the case where $\epsilon_{\alpha\beta} + k\Omega = \omega_c$ for a particular k, then the rotating wave approximation (RWA) gives the time-independent interaction Hamiltonian:

$$V_{int}^{RWA} = g(a\sigma_{\beta\alpha}\langle 1|\sigma_{\beta\alpha}^{-k}|2\rangle + h.c.$$

In this framework, $\epsilon_{\alpha\beta}$ is the energy difference between the Floquet quasi-energy levels of the Floquet states $\alpha$ and $\beta$. Additionally, $\sigma_{\alpha\beta}^{-k}$ is the k-th harmonic Fourier component of the Floquet state projector $\sigma_{\alpha\beta}$, which acts on the Floquet state $\beta$ to yield the Floquet state $\alpha$.

This is just the interaction picture Jaynes-Cummings Hamiltonian in the usual rotating wave approximation, except that the coupling strength has been scaled by a matrix element. This is remarkable because it means that in the interaction picture, the strongly driven gain medium can engage in simple two-level dynamics with a cavity which is at a frequency $\epsilon_{\alpha\beta} + k\Omega$. If k is large, as it can be when the drive is sufficiently strong, then this may allow interaction with a cavity which is at a higher frequency than energy differences present in the undriven system.

Modulation Strength

While various embodiments are described, time varying lasers in all of these embodiments can be characterized in terms of the type of time modulation which is applied. In particular, a time varying gain medium, which may be a Floquet gain medium, comprises some system of matter with a time independent Hamiltonian $H_0$ which has applied to it and an external time-modulation which is captured through the Hamiltonian $H_{mod}(t)$ so that the time-dependent Hamiltonian of the total system is $H_0(t) = H_0 + H_{mod}(t)$. The unmodulated Hamiltonian has some energy scale associated with it (for example, in the case of an electron in an atom, the potential and kinetic energy of the electron). Likewise, the modulation has a "modulation strength" associated with it, depending on the strength of the applied modulation. For example, an external electric field which modulates the dipole moment of the matter system will have a modulation Hamiltonian of the form $H_{mod}(t) = -\mu \cdot E(t)$ where $\mu$ is the dipole moment operator of the matter system, and E(t) is an externally applied electric field. To characterize the interaction strength, the applied external field may be written as $E(t) = E_0 f(t)$. Here, $E_0$ is a constant with units of electric field, and f(t) is a unitless time-dependence of order unity. Thus, the energy scale of the interaction is roughly $\Delta E \equiv |E_0 \mu|$ where $\mu$ now represents the dipole moment of a characteristic transition between energy levels in the matter system. The system is defined as being weakly driven when $\Delta E$ is much smaller than the energy scales present in $H_0$. The system is defined to be strongly driven when $\Delta E$ is no longer negligible compared to the energy scales present in $H_0$.

As an illustration, an example of a two-level model is described below. In particular, the Hamiltonian is defined as:

$$H_0(t) = \frac{\omega_0}{2}\sigma_z + \frac{\delta\omega}{2}\cos(\Omega_0 t)\sigma_z.$$

In this equation, $\omega_0$ is the frequency of the undriven 2-level transition, $\delta\omega$ defines the strength of the modulation at frequency $\Omega_0$ and $\sigma_z$ is the Pauli matrix defined in its usual convention. Note that a two-level system modulated at a single frequency can also be written in a form $$H_0(t) = \frac{\omega_0}{2}\sigma_z + \frac{\delta\omega}{2}\cos(\Omega_0 t)(n_x\sigma_x + n_y\sigma_y + n_z\sigma_z),$$

where $\eta_i$ are real numbers. While the example shows a periodic modulation with only a single frequency (i.e. cos($\Omega_0 t$)), similar results may be found for systems which are periodically modulated with a signal which contains more than one frequency (e.g., a sawtooth), allowing the modulation to have an arbitrary waveform which is not purely sinusoidal. The example of a sinusoidal modulation is used as this is the one which is most readily implementable in many real systems, but many other temporal modulations may be utilized as well. Additionally, non-periodic modulations may be utilized.

For the two-level system which is modulated through $\sigma_z$, the time dynamics are purely analytical. In particular, the unitary evolution operator is $U_0(t) = e^{-i\omega_0\sigma_z t/2} e^{-i(\delta\omega/2\Omega)\sigma_z \sin\Omega t}$. A fractional modulation parameter is defined as $\eta = \delta\omega/\Omega_0$. This parameter enables the characterization of different regimes of behavior. The larger the value of $\eta$, the more harmonics can be involved in the Floquet lasing process. As a rough guideline:

Values $\eta < 0.1$ will lead to perturbative effects in which only the first harmonic can efficiently participate, as the strength of each Floquet sideband will decrease rapidly with increasing harmonic number.

Values $0.1 \leq \eta < 1$ will lead to strong modulation effects in which more than one Floquet side band may interact substantially in the system.

Values $\eta > 1$ will lead to very strong modulation effects in which the modulation component of the Hamiltonian is critically important, and can lead to effects involving many harmonics. Importantly, in this regime, transitions between higher order Floquet levels may actually dominate over the transition associated with the unmodulated system. Very large parameters have been achieved in superconducting microwave systems. Note that this is the regime in which "inversionless" Floquet lasing (described later) will be most accessible.

Note that while the fractional modulation parameter is defined for this case of a modulated two-level system, similar characterizations are possible for more complex systems, and the three regimes of behavior which are noted above should still be present.

This time modulated field may be provided in a variety of ways. For example, in many embodiments, the external field will take the form of an electric field created by another system. This external field may come from a continuous wave (CW) laser, or from a pulsed laser that is used to generate short but intense pulses. The strength of the pulsed system needed to generate the field will depend on the frequency of the laser that is being created. For example, anything done in the UV-to-X-ray regime may require very strong driving pulses with field intensities of MW/m$^2$-TW/m$^2$.

Further, the frequency of the external field may also depend on the type of system under consideration. For a UV-X-ray system based on high harmonic generation gasses, the driving field may be in the IR-optical range where strong pulsed laser sources can be created. Wavelengths in the range of 10 μm-400 nm may be useful in many configurations, though the boundaries are not necessarily strict.

If it is desirable to move the gain transition slightly in an existing gain medium (for example, HeNe gas laser) via time varying modulation, then external modulation fields of frequencies in the MHZ-GHz range may be used. In practice, such fields may be created by taking two IR/optical laser sources which are slightly detuned, so that the beating pattern of the field produces the desired modulation.

Gain at New Frequencies

One key characteristic of time varying gain media (and laser devices based on time varying gain media) is that they can provide gain (and a corresponding laser action) at frequencies which are not present in the gain bandwidth of the unmodulated material. The phrase "gain bandwidth of the unmodulated material" is defined as the range of frequencies over which gain is present:

For example, for an atomic-transition based gain medium such as Nd:YAG or HeNe, the gain bandwidth is defined by some center frequency $\omega_0$ corresponding to the frequency of the atomic transition, and some bandwidth $\Delta\omega$ which is the full width at half max (FWHM) over which the gain occurs.

For example, for a semiconductor gain medium, such as AlGaAs, the gain bandwidth of a given material and environment (e.g., including the ambient temperature) comprises some range of frequencies near the bandgap frequency of the material.

Thus, in a Floquet laser, by periodically modulating a material, at some driving frequency $\Omega_0$, it is possible to create gain which is centered around frequencies $\omega_0+k\Omega_0$. If any of these new gain frequencies $\omega_0+k\Omega_0$ lies outside of the gain bandwidth of the unmodulated material, then the gain is said to have been produced at new frequencies via the Floquet mechanism. Depending on whether the integer k is positive or negative, the new gain/lasing frequencies may be higher or lower than the original frequency. Also note that $\omega_0$ denotes a gain frequency which can be any frequency in the original lasing bandwidth, and is not, for example, limited to the single gain frequency that is associated with an atomic transition. There may also be cases in which some material does not act as a gain medium at any frequency in the absence of Floquet driving, but does act as a gain medium at one frequency, or a range of frequencies, in the presence of Floquet driving. Such a system would also be considered to have gain at new frequencies provided by the Floquet mechanism.

FIG. 1 shows examples of how Floquet modulation can change the gain spectrum of a gain medium. In the left panel, a representative gain spectrum of an unmodulated medium, which has some center frequency and bandwidth, is shown. In the right panel, a representative gain spectrum for a Floquet gain medium for a generic driving frequency and fractional modulation strength is shown.

Modes of Operation of a Floquet Laser

Figure 2:
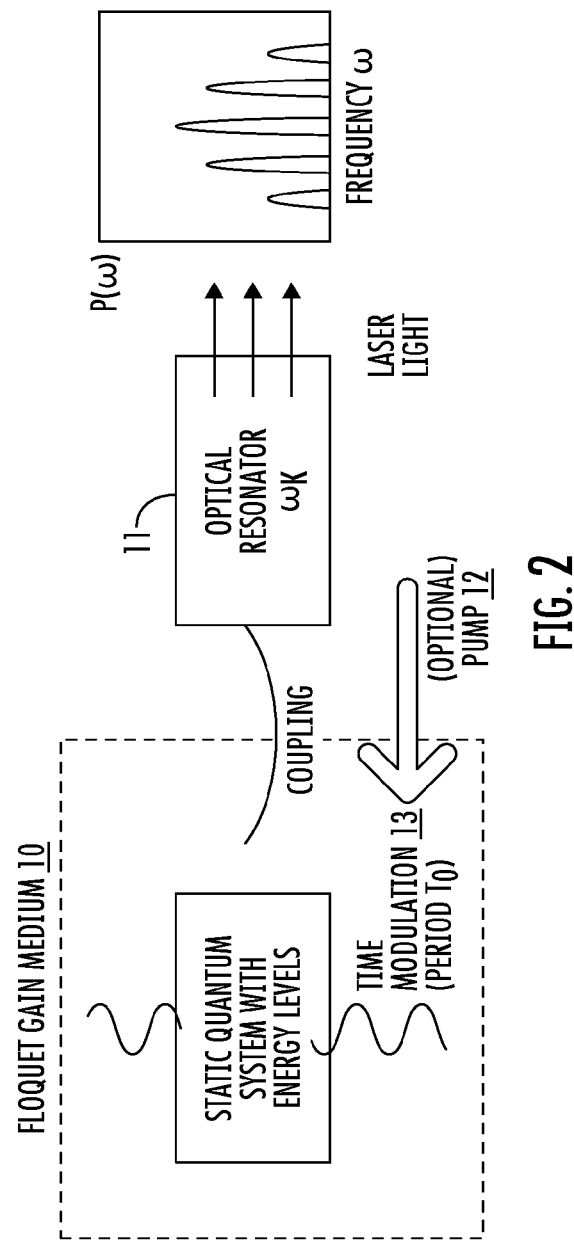
FIG. 2 shows a general schematic of a Floquet laser.

Several different regimes of operation of devices are disclosed, all which fall broadly under the umbrella of "Floquet lasers". FIG. 2 shows a high level schematic of the device which is referred to as the "Floquet laser". The device comprises a "Floquet gain medium" 10, an optical resonator 11, and optionally, an additional source of energy 12 which moves population around the energy levels of the system in order to create conditions for lasing (e.g., population inversion). The Floquet gain medium 10 comprises some quantum system with energy levels which is driven by some external modulation 13, which is periodic in time. This time periodicity is a key element which distinguishes this device from lasers that have been previously realized, and will enable new functionalities in the device described herein. The optical resonator 11 can be resonant at one or more frequencies, and is weakly coupled to the Floquet gain medium 10 to allow for electronic excitations to be converted into radiation. When operated, this device can produce narrow bandwidth light at one or more frequencies. Importantly, as noted above, the Floquet gain medium 10 may enable the generation of radiation at new frequencies compared to what would be generated by the unmodulated gain medium.

A framework is defined in which the lasing transitions take place between two Floquet levels of the driven system. The levels are given the labels α and β, with corresponding quasi-energies $\in_\alpha$ and $\in_\beta$ respectively. Depending on which frequency, or multiple frequencies, are chosen for the cavity resonance, the laser may operate in three different configurations. These configurations are described below.

Ability to Operate at a Frequency which is Shifted from the Undriven Frequency by an Integer Multiple of the Driving Frequency In this configuration, the laser can operate resonantly at frequencies $\omega=\in_\alpha-\in_\beta+k\Omega_0$, where k is an integer. In this configuration, the cavity is assumed to only be resonant with a single frequency, corresponding to a single integer k. Note that when couplings are present which renormalize the energy levels, the pump strength can potentially be used to tune the resonance to the desired frequency. The feature of frequency shifting may enable the creation of gain media at frequencies at which it is very hard to do so by other means. For example, this mechanism may have the potential to enable gain media at extreme ultraviolet (EUV) and X-ray frequencies by leveraging developments in strongly driven systems, such as those used in high harmonic generation (HHG).

Ability to Coherently Lase into One or More of these Harmonic Frequencies Simultaneously In this configuration, the cavity is assumed to be resonant with multiple frequencies simultaneously, corresponding to more than one integer k. This mode of operation can lead to lasing into multiple frequencies which are coherent with one another. In this configuration, the multi-mode lasing is actually desirable since it allows the creation of multimode coherent states of light. This is in contrast to multimode behaviors in traditional lasers, which are often considered undesirable due to the fact that they can lead to increased linewidth, noise, and instability.

Another key difference between Floquet multi-harmonic lasing and traditional multi-mode laser effects comes about from the way that the device behaves near the laser threshold. In traditional multimode laser settings, modes can be considered individually with respect to threshold. Specifically, the first mode to lase is the first mode which reaches threshold depending on the modal gain and loss. Then, as the pump strength is increased, additional modes may begin to lase as well. In some situations, all of the modes may lase simultaneously, while in other situations, one mode may "win" and take up all of the gain so that other modes cannot lase. In contrast, for the multi-harmonic Floquet laser, the idealized system possesses a single threshold, at which all of the modes can begin lasing. This threshold is set by a combination of all of the modal losses and spontaneous emission rates into the cavity, which may be different for each mode. In the case that all but one mode has low spontaneous emission rate, or high loss, the threshold description reduces to that of traditional single-mode lasing. More specifically, by involving more modes with the lasing process, one actually reduces the threshold compared to that of the single mode lasing configuration.

The interaction picture Hamiltonian of such a laser (in the rotating wave approximation) is:

$$V = \sum_k \left(g_k a_k \sigma_+ + g_k^* \sigma_- a_k^\dagger\right) = g_{eff}\left(A\sigma_+ + \sigma_- A^\dagger\right)$$

where $\alpha_k$ is the annihilation operator, and $g_k$ is a modified coupling coefficient which can be obtained from Floquet theory. In the second equation, the following definition is used:

$$A \stackrel{def}{=} \frac{1}{g_{eff}} \sum_k g_k a_k$$

where the effective coupling is $|g_{eff}|^2 = \Sigma_k |g_k|^2$ for all relevant transitions. Then, an excitation number operator may be defined as $N \stackrel{def}{=} A^\dagger A$ which behaves the way that the single mode number operator does for a normal single-mode laser.

By expanding the explicit form of the operator A, and using the definition $R_{lm} = 2g^*_l g_m / \gamma_\perp$, the equations of motions may be written as:

$$\dot{a}_{lm} = \frac{1}{2}(\kappa_l + \kappa_m)a_{lm} + \frac{D}{2}\sum_k (R_{kl}a_{km} + R_{mk}a_{lk}) + F^{(lm)}$$

$$\dot{D} = \Lambda - \gamma_\| D - D\sum_{l,m} R_{lm}a_{lm} + F_D$$

The same-mode coefficients $$R_{ll} = \frac{2|g_l|^2}{\gamma_\perp}$$

are the spontaneous emission rates into each of the modes. The variables are defined as follows: R represents spontaneous emission rate, K represents the damping rates, D is the inversion, $\Lambda$ is the inversion pumping rate, and $\gamma_\|$ is its corresponding relaxation rate. Additionally, $F^{(lm)}$ and $F_D$ are operator valued Langevin forces.

One of the most important characteristics of a multi-mode Floquet laser is its steady state behavior. A particularly important aspect of the steady state behavior is encoded in the mean values of the equations of motion above. These are obtained by taking expectation values of the equations above, in which case the Langevin forces vanish, and all operators are turned into c-numbers. These equations of motion, despite being nonlinear, have a clean analytical solution in terms of the spontaneous emission rates $R_{lm}$, the damping rates $K_l$, the inversion pumping rate $\Lambda$, and its corresponding relaxation rate $\gamma_\|$.

In the case that all losses for the modes are the same, and the polarization lifetime is short compared to the cavity and inversion lifetime, a system of rate equations for a 4-level model multi-mode Floquet laser is written as:

$$\dot{N} = (R_{sp}D - \kappa)N$$

$$\dot{D} = \Lambda - \gamma_\| D - R_{sp}DN$$

In these equations, $N \equiv (1/R_{sp})\Sigma_{l,m}R_{lm}\alpha_{lm}$ is the collective excitation number for the combined modes, and $R_{sp} = \Sigma_l R_l$ is the sum of all spontaneous emission rates into the modes. K is the energy damping rate of the cavity mode. D is the population inversion of the laser. $\gamma_\|$ is the population inversion relaxation rate. $\Lambda$ is the pumping rate for the inversion. This pair of equations is identical to those which are used to describe a class B conventional laser. Thus, in the steady state, $D=K/R$, and $N=\Lambda/K-\gamma_\|/R$.

In this case, any transient phenomena that would normally be associated with a class B laser carry over quite directly to the multi-mode Floquet case. The only difference is that the total excitation number N takes the place of what would normally be the place of the photon number for a single mode. One of the immediate implications of this is that when perturbed from equilibrium, the multi-mode system can exhibit nonlinear relaxation oscillations as it returns to its steady state. These transient phenomena will manifest in terms of well-known "spiking" of the excitation number pair with a nonlinear oscillating inversion.

A more complicated set of equations can also be written to describe the case in which the modal losses can take different values $K_l$ for each mode l. In this case, in the steady state, the photon numbers across l modes are given by the analytical expression:

$$n_l = \frac{R_l}{k_l^2}D(\Lambda - \Lambda_{th}).$$

Here, D is the saturated inversion, which in steady state is given by analytical form:

$$\frac{1}{D} = \sum_l \frac{R_l}{\kappa_l}.$$

In other words, the saturated inversion has contributions from each mode which add "in parallel" to each other. In the case of a single mode 1, this condition reduces to $DR_1 = K_1$, which is in agreement with the "saturated gain equals loss" condition of a standard single mode laser. Moreover, any modes which have either (1) an extremely low spontaneous emission rate, or (2) an extremely high loss, will not contribute strongly to inverting the medium.

Similar to a conventional laser, the threshold pump rate is found to be $\Lambda_{th} = \gamma_\| D$, where D is the saturated inversion defined above. The above-threshold values of $\alpha_{lm}$ are given by:

$$a_{lm} = \frac{R^*_{lm}}{\kappa_l \kappa_m}D(\Lambda - \Lambda_{th})$$

For the special case of the photon numbers in each mode (n=1), this means that:

$$n_l = \frac{R_l^*}{\kappa_l^2} D(\Lambda - \Lambda_{th})$$

Thus, the behavior of the number in each mode above threshold is quite similar to that in a conventional laser, except that multi-mode saturated inversion is used, as well as the spontaneous emission and loss rates characteristic of each harmonic mode. Additionally, the steady state occupation numbers of the modes are distributed in proportion to $$\frac{|g_l|^2}{\kappa_l^2}$$

for each mode, so that different mode occupations obey the relation:

$$\frac{n_l}{n_k} = \frac{|g_l|^2 \kappa_k^2}{|g_k|^2 \kappa_l^2}.$$

Figure 8:
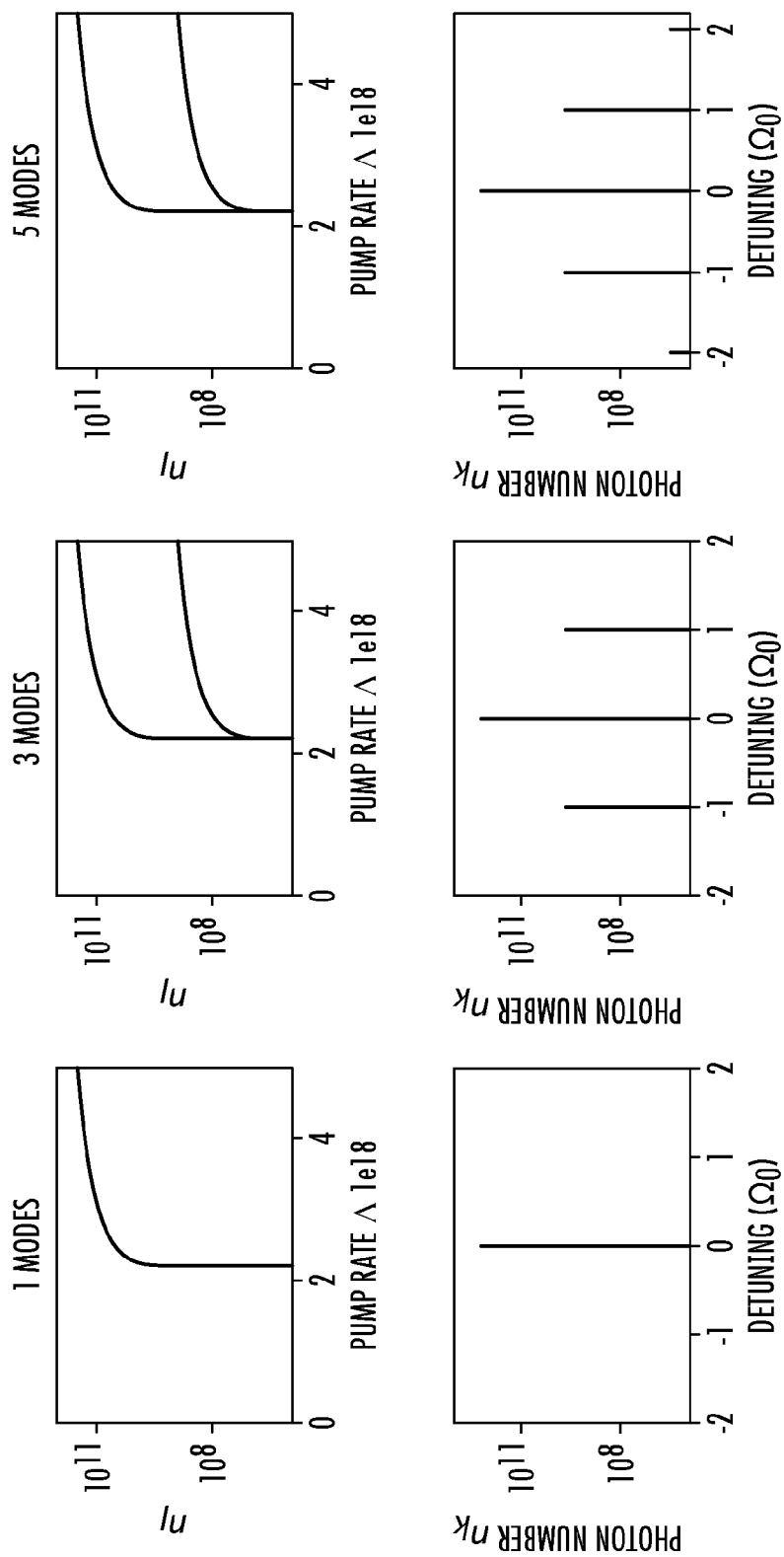
FIG. 8 shows the steady state photon numbers as a function of pump rate in the case that 1, 3, and 5 modes are included in the lasing process where η=0.1.
Figure 10:
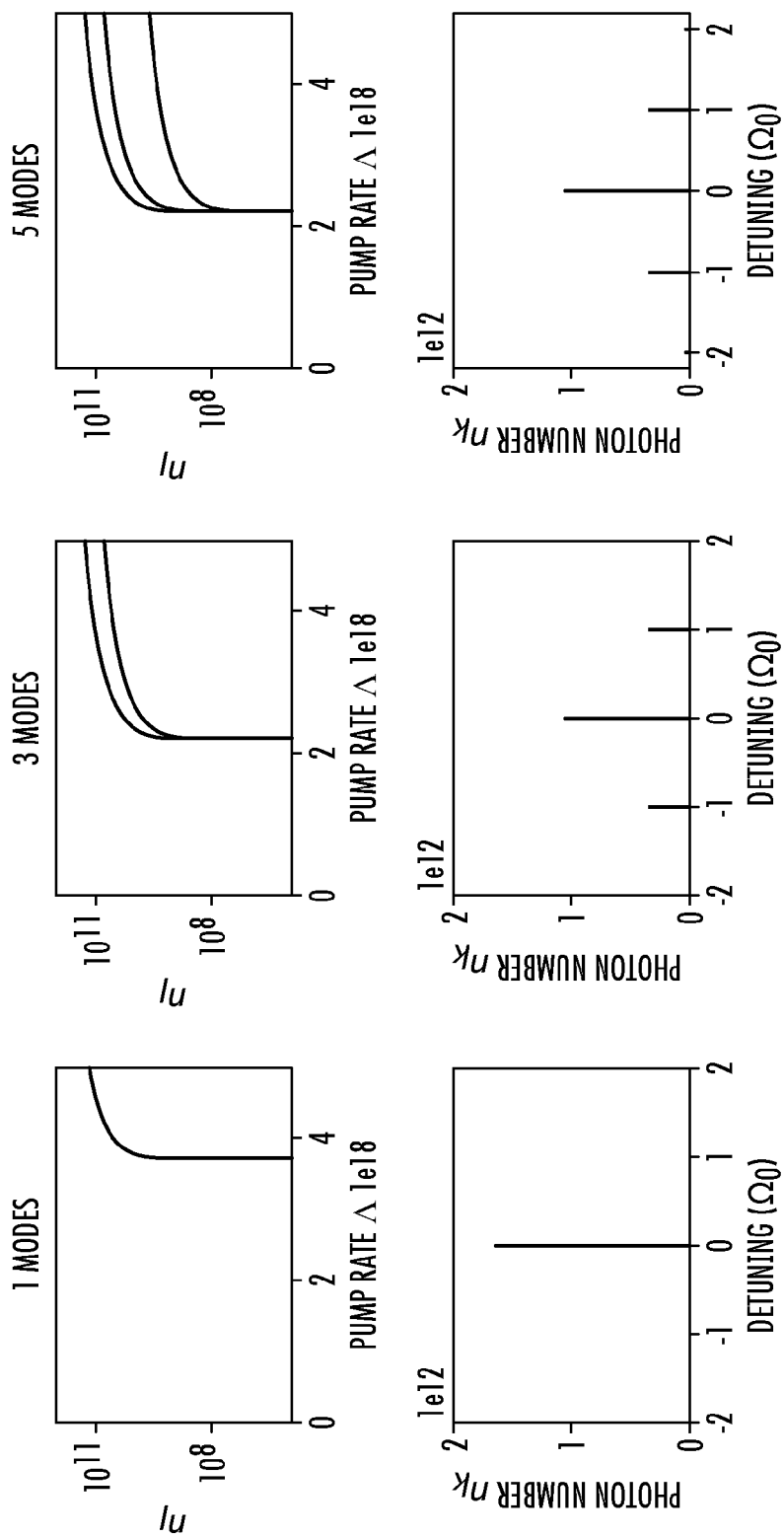
FIG. 10 shows the steady state photon numbers as a function of pump rate in the case that 1, 3, and 5 modes are included in the lasing process where η=1.0.
Figure 12:
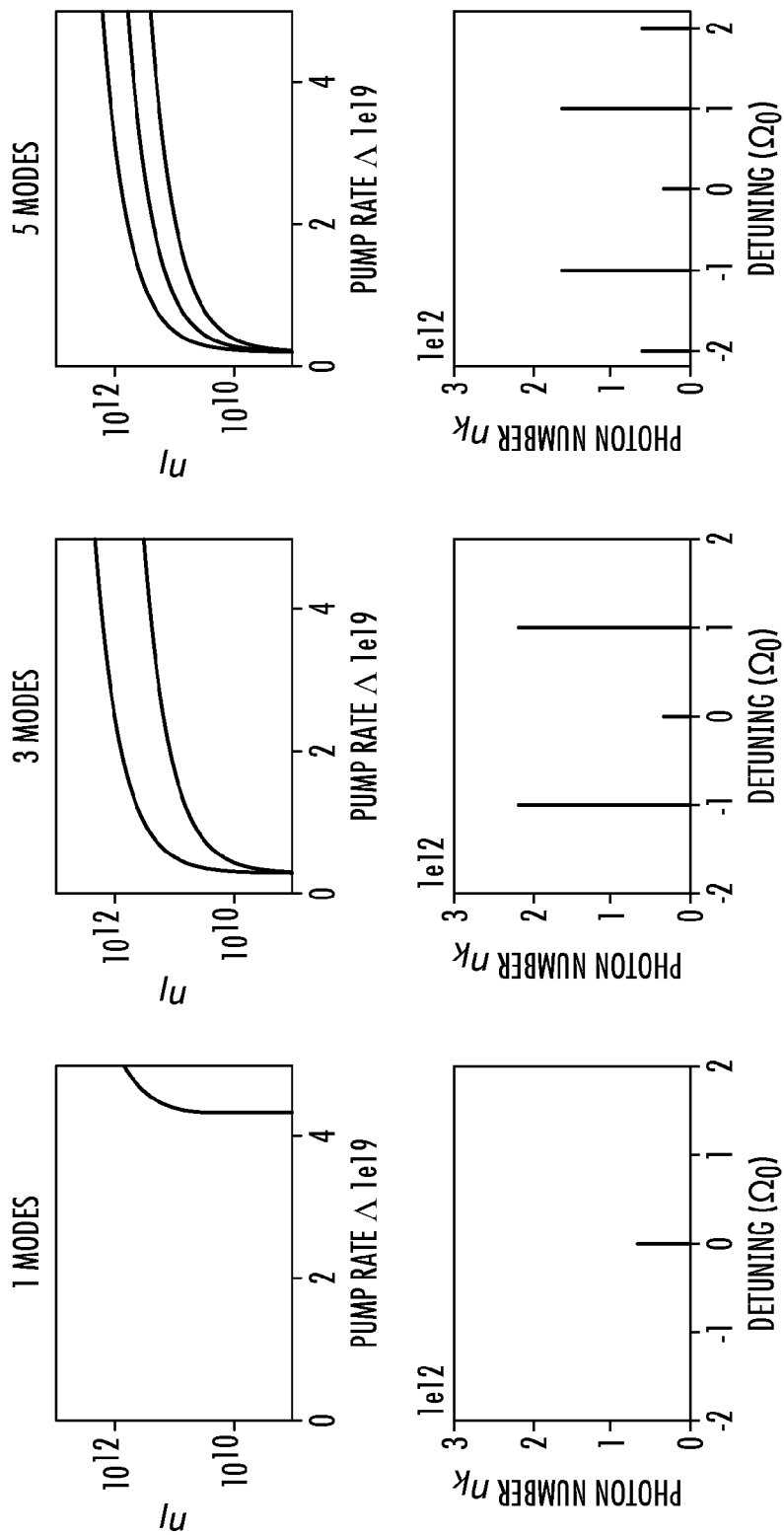
FIG. 12 shows the steady state photon numbers as a function of pump rate in the case that 1, 3, and 5 modes are included in the lasing process where η=2.0.

One notable feature is that the Floquet laser possesses a single threshold for operation, rather than a threshold for each mode, as is more typical in conventional multi-mode laser operation. In other words, all modes of the Floquet laser reach threshold at the same time, despite the fact that each of the modes individually may have different spontaneous emission and loss rates. The threshold behavior for single and multi-mode cases is shown in FIGS. 8, 10 and 12. This is described in more detail below.

This type of multi-harmonic configuration can for example be realized by designing a cavity whose free spectral range (FSR) is equal to the modulation frequency, or a multiple of the modulation frequency. By doing so, one can create a device which emits into multiple longitudinal modes of the cavity simultaneously and coherently. Such a configuration can be used to generate ultrashort pulses of light.

Ability to Lase in the Absence of Conventional Population Inversion

A conventional time-independent laser makes stimulated emission transitions between a state of higher energy, and a state of lower energy (often referred to as the "excited state" and "ground state" respectively). In such a conventional laser, the system is required to reach a state of "population inversion" before any lasing can occur. "Population inversion" in this disclosure is defined to denote that the electron (or whatever particle is providing the gain) has a higher probability of residing in the excited state than the ground state. For an undriven system in thermal equilibrium, such a system cannot possess a inversion, since the distribution of population population is given by thermal statistics, which dictate that higher energy levels possess lower occupation probabilities. Thus, the thermal equilibrium state of such a system cannot provide laser gain. In conventional lasers, this issue is overcome by introducing a pumping scheme: an additional source of energy into the system which inverts the population, allowing for stimulated emission to overcome absorption.

In a Floquet laser, the way that equilibration toward a ground state works can be fundamentally different. Such a driven system can still possess a thermodynamic Floquet ground state toward which the system will evolve in the absence of any additional excitation. This state is referred to as the "Floquet ground state". The modes of Floquet laser operation described above were based on transitions from a Floquet excited state to the Floquet ground state. Methods of operation are also possible which are based on stimulated emission from the Floquet ground state to a Floquet excited state. This Floquet excited will then thermodynamically re-equilibrate back to the Floquet ground state, and the process continues. Another way to conceptualize this mode of operation is that the modulation is so strong that Floquet quasi-energy levels of the excited state are pushed below the level of the original ground state, so that ground to excited transitions are allowed in the Floquet laser, and will occur spontaneously (or with stimulation).

This mechanism can be considered a novel form of lasing without inversion (LWI) since the system will make stimulated emission transitions from the Floquet ground state to a Floquet excited state. In this case, gain is possible in the absence of any inversion of population between the Floquet ground and Floquet excited states. In fact, in this configuration, gain may only be possible when the system is uninverted.

FIGS. 3A-3F illustrate various modes of operation of Floquet lasers in terms of Floquet level diagrams for two-level systems. In these illustrations, it is assumed that there are two Floquet states which are responsible for the lasing transition. In doing so, other potential energy states which may reside in the system are not shown, as they are not critical to the description of the device. This is similar to the two-level description of lasers which has historically been given, except that these states are time dependent.

FIG. 3A illustrates the operation of a traditional laser, which performs spontaneous or stimulated emission as the gain medium makes a transition from an upper state 30 to a lower state 31. The arrow indicates the transition from the upper state 30 to the lower state 31. This is illustrated as a point of comparison.

FIG. 3B illustrates the operation of a Floquet laser which operates at a single frequency which is lower than that in the unmodulated case. In other words, the difference between the upper Floquet state 32, also referred to as the excited state and the lower Floquet state 33, also referred to as the ground state is less in FIG. 3B than it is in FIG. 3A. In this embodiment, the time modulation has transformed the static gain medium into a Floquet gain medium. In such a Floquet gain medium, the system may perform spontaneous or stimulated emission via a transition from the upper Floquet state 32 to the lower Floquet state 33 by the emission of a photon which is shifted in frequency from that in the unmodulated case. Such a scheme may be useful for the generation of coherent radiation in the mid-far IR and THz regimes.

FIG. 3C illustrates the operation of a Floquet laser which operates at a single frequency which is higher than that in the unmodulated case. In other words, the difference between the excited state 34 and the ground state 35 is greater in FIG. 3C than it is in FIG. 3A. The same principle applies as in FIG. 3B, except that now the transition is to a lower Floquet sublevel, so that the lasing frequency is higher than that of the unmodulated system. Such a scheme may be useful for the generation of coherent radiation in the UV and X-ray regimes. Note that the number of harmonics by which the lasing transition has been shifted has been depicted as a shift of 2 harmonics, but a shift of an arbitrary number of harmonics is possible.

FIG. 3D illustrates the operation of a Floquet laser which operates at multiple frequencies simultaneously. The higher Floquet sublevel 36 transitions to multiple lower Floquet sublevels 37a, 37b, 37c, 37d. These frequencies may include frequencies which are the same, higher than, or lower than the unmodulated transition frequency.

FIG. 3E illustrates the operation of a Floquet laser which operates via spontaneous and stimulated emission transitions between the Floquet ground state 38, and the Floquet excited state 39. This is possible if the Floquet modulation is sufficiently strong that Floquet sub-levels of the excited state are brought below the level of the Floquet ground state 38. This enables a type of "inversionless" lasing in which no additional pumping to population inversion is required.

FIG. 3F illustrates the operation of an "inversionless" Floquet laser (as in FIG. 3E) which operates at more than one frequency. There are multiple Floquet excited states 40a, 40b, 40c that are below the level of the Floquet ground state 38. This mode of operation can be conceptualized as a combination of FIGS. 3D and 3E.

Coherence of Lasers Based on Time-Dependent Gain Media

It is believed that, far above threshold, the final state may be a coherent state in the N basis, which corresponds to a multi-mode coherent state for each of the modes. As noted above, the interaction picture Hamiltonian for a multi-mode laser is:

$$V = \sum_k \left(g_k a_k \sigma_+ + g_k^* \sigma_- a_k^\dagger\right) = g_{eff}\left(A\sigma_+ + \sigma_- A^\dagger\right)$$

where, as before, $$A \equiv \frac{1}{g_{eff}} \sum_k g_k a_k.$$

Since the creation and annihilation operators for individual modes satisfy the bosonic commutation relations $[\alpha_m, \alpha_n^\dagger] = \delta_{mn}$, it follows that:

$$[A, A^\dagger] = \frac{1}{g^2} \sum_{m,n} g_n g_m^* [a_n, a_m^\dagger] = 1$$

Furthermore, the operator A annihilates the ground state which contains no photons in any mode $\langle A|0\rangle = 0$. Thus, it follows from these properties that the operators A, $A^\dagger$ describe a harmonic oscillator which represents the joint excitations of photons across all modes which are involved. From here, number states of the joint excitation $|N\rangle$ which satisfy the typical relations $A|N\rangle = \sqrt{N}|N-1\rangle$ and $A^\dagger|N\rangle = \sqrt{N+1}|N+1\rangle$ can be defined.

Additionally, it can be seen that the joint number operator $N = A^\dagger A$ represents a weighted sum over the occupation numbers of the individual modes which comprise the photonic space of interest. To see this, consider the action of $A^\dagger A$ on a state which contains $n_k$ photons in modes numbered $k = 1, \ldots, M$. Doing so:

$$\langle n_1, n_2, \ldots, n_M | A^\dagger A | n_1, n_2, \ldots, n_M\rangle = \frac{1}{g^2} \sum_k |g_k|^2 n_k$$

Hence, the expectation value of $A^\dagger A$ on a Fock state gives a sum of the occupation numbers in each mode $n_k$ which is weighted by the fraction $$\frac{|g_k|^2}{g^2}.$$

Since the total coupling coefficient $g^2$ is given as a sum over $|g_k|^2$ for all k, the weighting quantity is less than or equal to 1.

It is a feature of traditional single-mode lasers far above threshold that they produce coherent or near-coherent states of light. It thus follows from the effective Hamiltonian for the multi-mode Floquet laser employed herein that far above threshold, the Floquet laser will produce a coherent state of the A operator $|\alpha\rangle_N$ which satisfies the eigenvalue relation for the joint annihilation operator $A|\alpha\rangle_N = \alpha|\alpha\rangle_N$ where $\alpha$ is a complex number which parameterized the amplitude and phase of the coherent state.

It can be shown that the occupation probabilities for each of the individual modes are the same as those of a multi-mode coherent state which can be expressed as a factorizable product of coherent states in each of the modes (i.e., $|\alpha_1, \alpha_2, \ldots, \alpha_M\rangle$.

The joint coherent state $|\alpha\rangle_N$ may be expanded as:

$$|\alpha\rangle_N = e^{\frac{-|\alpha|^2}{2}} \sum_n \frac{\alpha^n}{n!}(A^\dagger)^n |0\rangle$$

The probability of finding a multimode Fock state $|k_1, k_2, \ldots, k_N\rangle$ is given by:

$$|\langle k_1, k_2, \ldots, k_N | \alpha\rangle_N|^2 = \frac{e^{-|\alpha|^2}|\alpha|^{2n}}{g^{2n}} \prod_{l=1}^{M} \frac{|g_l|^{2k_l}}{k_l!}$$

where $\eta = \sum_l^M k_l$ denotes the total occupation number. These occupation probabilities are consistent with that of a multimode coherent state, and thus represent the statistics of the output laser field.

Further, under the right configuration, a Floquet laser may be used to sustain lasing without inversion (LWI). The Hamiltonian for the gain medium, a single cavity mode at frequency $\omega_c$ and coupling to an external bath for damping is:

$$H(t) = \frac{\sigma_z}{2}[\omega_0 + \delta\omega\cos(\Omega_0 t)] + \omega_c a^\dagger a + g\sigma_x(a + a^\dagger)$$

The atom-cavity Hamiltonian is then taken in the RWA for some $k<0$ which satisfies $-\omega_k = -(\omega_0 + k\Omega) = \omega_c$. In this case, the RWA interaction Hamiltonian which is now time independent becomes:

$$V_{eff} = gJ_k(\sigma_- a + \sigma_+ a^\dagger).$$

This Hamiltonian accounts for the process in which a photon is emitted as the atom "relaxes" from the ground state to an excited state. This results in a laser that operates only for negative inversion levels.

The decay rate for the inversion can be defined using the density matrix equations:

$$\dot{\rho}_{ee} = -\Gamma_e \rho_{ee} + \Gamma_g \rho_{gg}$$

$$\dot{\rho}_{gg} = -\Gamma_g \rho_{gg} + \Gamma_e \rho_{ee}.$$

$\rho_{ee}$ is defined as the population in the Floquet excited state, $\rho_{gg}$ is defined as the population in the Floquet ground state, $\Gamma_e$ is defined as the total rate of transition between the Floquet excited state and the Floquet ground state, and $\Gamma_g$ is defined as the total rate of transition between the Floquet ground state and the Floquet excited state. By converting to an equation of motion for the inversion ($d = \rho_{ee} - \rho_{gg}$), it can be seen that:

$$\dot{d} = -2(\Gamma_e \rho_{ee} - \Gamma_g \rho_{gg})$$
$$= (\Gamma_e + \Gamma_g)\left[\frac{\Gamma_g - \Gamma_e}{\Gamma_g + \Gamma_e} - d\right]$$
$$\equiv \gamma_{\shortparallel}(d_0 - d)$$

As expected, this shows that in the absence of any cavity field, the inversion level should damp toward its equilibrium value:

$$d_0 = \frac{\Gamma_g - \Gamma_e}{\Gamma_g + \Gamma_e}$$

Cavities

Throughout this disclosure, lasers and masers are described that utilize a cavity. The cavities used to create these Floquet lasers may take many forms.

In many embodiments, the choices for the cavities follow from the types of cavities which are used in conventional lasers. For example, at microwave frequencies (for maser operation), a cavity may comprise a closed or partially closed metallic structure which supports resonances at the appropriate frequency or frequencies. In some cases, the cavity may take the form of a transmission line/wire in a superconducting circuit.

At infrared/optical frequencies, the cavity may comprise two or more mirrors in a configuration that allows for the sustained resonance of one or more modes. The mirrors may be curved or flat, and potentially have frequency dependent reflectivity in order to control the modes which can resonate. In the context of a semiconductor laser, or any integrated photonic laser, the cavity may be formed by photonic nanostructures, such as the reflection of waves off of a facet, or reflections off of more complex engineered Bragg or ring resonator structures to provide the desired reflectivity.

At UV/X-ray frequencies, structures based on Bragg reflection may be constructed to allow for maximally reflective structures to be created at these high frequencies. For UV wavelengths, periodicity in the Bragg structure may come from thin (1 nm to 100 s of nm) layered films of refractive materials which enable substantial reflectivities. For extreme UV-X-ray wavelengths, Bragg scattering off of the lattice planes of an atomic crystal may allow X-rays to reflect off of such a crystal, provided that the source is incident on the sample at the correct Bragg angle. In situations in which it may not be possible to construct a suitable cavity at such high frequencies, a Floquet gain medium that provides sufficiently high gain may be able to function as a single-pass amplifier in absence of any cavity.

Pumps

For Floquet lasers which are explicitly pumped to inversion, the appropriate pump for each gain medium largely follows from, but is not necessarily limited to the types of pumps which are typically employed in existing laser systems. Examples include:

a. Gas-based gain media which are pumped by electrical discharge (such as in standard HeNe lasers), or another laser at an appropriate frequency where absorption to the excited state in the gain medium is high.

b. Solid state gain media (such as Nd:YAG and similar materials) which are pumped by flashlamp discharge, or another laser at an appropriate frequency where absorption to the excited state in the gain medium is high.

c. Semiconductor gain media which are pumped by an electrical current passed through the terminals of the device by an external current source.

For Floquet lasers which operate in the inversionless configuration, no explicit pump source is needed.

Embodiments of Floquet Lasers

The Floquet lasing concept is quite general, and may potentially apply to a variety of systems across a wide range of frequencies. Here, various potential embodiments of Floquet lasers/masers are enumerated. Note that the term "laser" is used when referring to frequencies in the THz-Xray regime (>500 GHz), and the term "maser" is used when referring to frequencies in the microwave regime or below (0 Hz-500 GHz).

Masers Based on Magnetic Field Modulations of Spin Transitions

One possible embodiment of a Floquet laser is at microwave (MHZ-GHz) frequencies, which may also be called a Floquet maser. Masers generally rely on magnetic dipole transitions in the maser gain medium in order to create coherent microwaves with high coherence and extremely low linewidth. By applying time modulation to a maser gain medium (such as spin centers in materials), it may be possible to turn the unmodulated gain medium into a Floquet gain medium which provides gain at different and/or multiple frequencies. These schemes may be a good candidate for the "inversionless" Floquet lasing scheme, since at these frequencies, Floquet driving fields of generally lower intensities are required to create a given fractional modulation parameter η. For example, in superconducting qubit systems, Floquet systems with η>10 have been realized experimentally, pushing considerably into the very strong Floquet driving regime in which the gain spectrum will become entirely reshaped.

Figure 4:
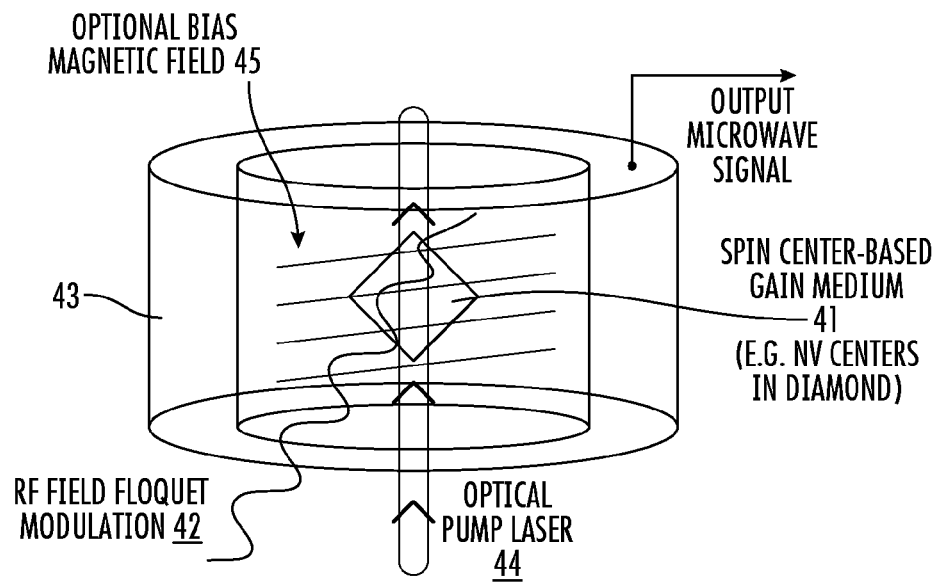
FIG. 4 shows a defect center Floquet laser according to one embodiment.

FIG. 4 shows one potential realization of a Floquet maser using an optically pumped spin center-based gain medium 41, which is then modulated by additional RF fields 42 to convert it into a Floquet gain medium. The spin center-based gain medium 41 may be NV (Nitrogen Vacancy) centers in diamond. The external resonator 43 (depicted here as a cylinder), supports one or more cavity modes, which are then outcoupled. The resonator 43 can be designed to support one or multiple frequencies, depending on whether single or multiple frequency operation of the Floquet maser is desired. Optionally, an optical pump laser 44 may be used as an external source of energy. Additionally, an optional bias magnetic field 45 may be included to provide fine control over the energy levels of the gain medium.

Masers Based on an RF Bias Field Acting on Qubit

Figure 5:
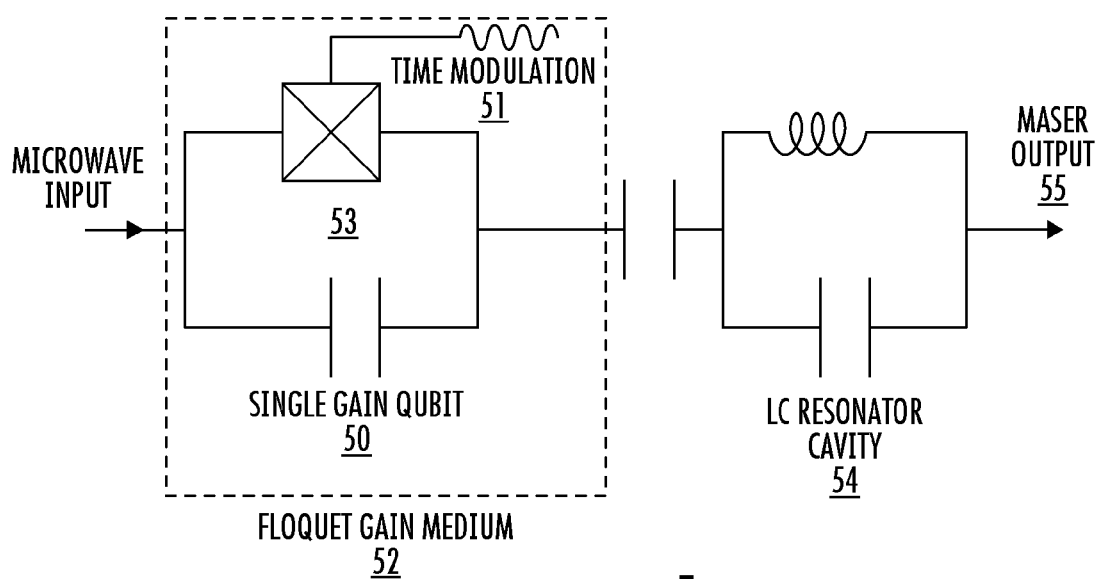
FIG. 5 shows a superconducting qubit Floquet maser according to one embodiment.

FIG. 5 shows one embodiment of a Floquet maser based on a single gain qubit 50 coupled to an LC resonator 53. A time modulation 51 applied to the system in the form of an RF bias field turns the stationary gain medium into a Floquet gain medium 52. Then, an additional LC resonator 54 acts as a cavity mode into which the pumped Floquet gain medium 52 can lase. The microwave output 55 is then extracted from the resonator 54. If it is desirable to lase into multiple frequencies simultaneously, more complicated resonators can be constructed which support multiple frequencies simultaneously. Note that due to the strong modulation parameters which can be induced in superconducting systems, this type of architecture presents a promising opportunity for the realization of the "inversionless" configuration of Floquet laser operation.

Floquet Gas Lasers

One possible embodiment of a Floquet laser is in gas lasers whose gain element (i.e., the gas) is strongly modulated in time by electrical, optical, or other means. In one example, a HeNe based gain medium is electrically pumped, and is additionally modulated in a time periodic manner. This time modulation may include, but is not limited to:
- Driving by a strong RF field such as that produced by a maser
- Driving by a continuous wave monochromatic or multichromatic IR/optical laser field
- Driving by a pulsed laser source, where the pulse period sets the Floquet drive frequency Since the gain transition in Neon at 630 nm has a small bandwidth (~1 GHZ), one way to see a strong effect may be to introduce a Floquet modulation at some frequency larger than the gain bandwidth, which is also within the regime of electronic modulations (i.e. 1-10 GHZ). Then, a Floquet modulation may be induced at such a GHz-scale frequency via a time-dependent Stark shift of the energy splitting of the laser transition. Since the modulation frequency in this case is quite low, relatively low optical intensities are required in order to achieve different regimes of the modulation parameter $\eta$.

Figure 15:
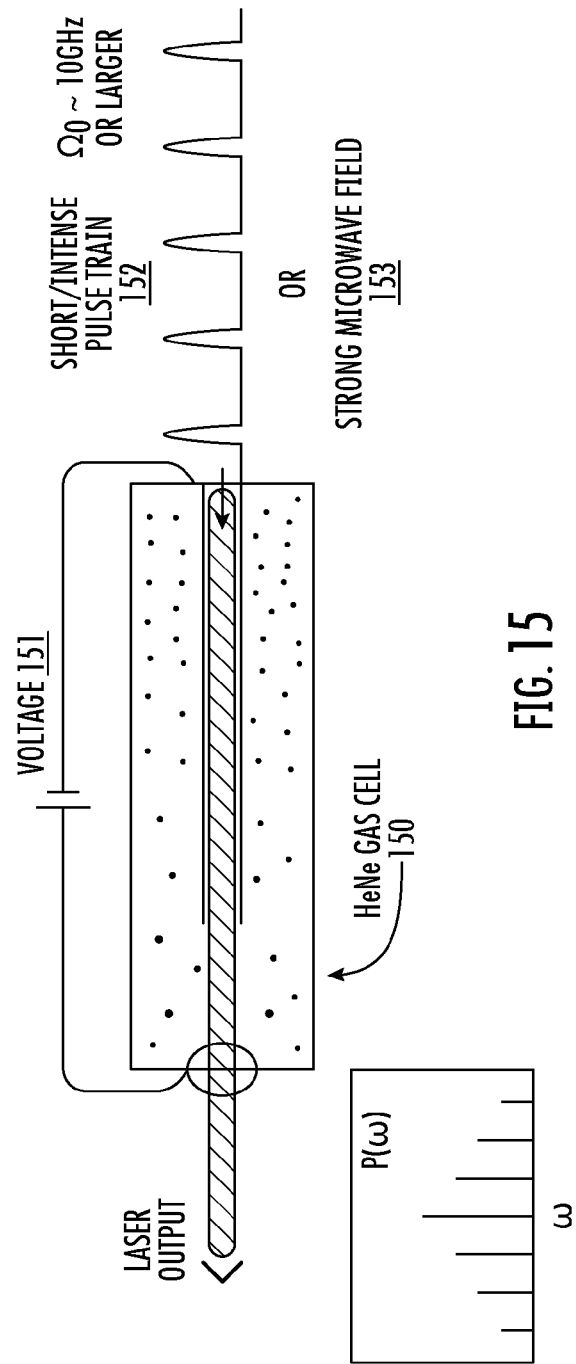
FIG. 15 shows a gas based Floquet laser according to one embodiment.

FIG. 15 shows a gas-based Floquet laser. In this embodiment, a gaseous gain medium 150 such as a mixture of Helium and Neon, is excited by a pump mechanism, such as a voltage discharge 151. Simultaneously, a Floquet modulation, which may be a pulse train 152 or a strong microwave field 153, is provided which causes the gain transition in Neon to split into multiple Floquet quasi-levels. Since the gain bandwidth of Neon is quite low (~1 GHZ), relatively low frequency modulation schemes can potentially be used to create Floquet gain at new frequencies.

IR-Optical Lasers Based on Modulated Solid State Gain Media

One possible embodiment of a Floquet laser is on solid state gain medium platforms. Examples of these platforms include, but are not limited to: Nd:YAG, Er:YAG, Nd:YVO4. In this embodiment of a Floquet laser, the gain medium is placed in an optical cavity, which can, for example, take the form of two partially reflective mirrors. The gain medium is then modulated with an external electric field of frequency $\Omega_0$ and strength $E_0$ which modulates the gain medium, turning it into a Floquet gain medium. The Floquet gain medium can then be pumped with an additional source of energy which is used to populate the Floquet excited state, generating inversion. Such an additional source of energy can be, for example, a flashlamp discharge, or another laser source chosen at an appropriate frequency.

The cavity/resonator can then be designed so that it is resonant with one or more of the Floquet transitions at frequencies $\in_{\alpha\beta}+k\Omega_0$, where $\in_{\alpha\beta}$ is the transition quasi frequency, and k is an integer.

Figure 6:
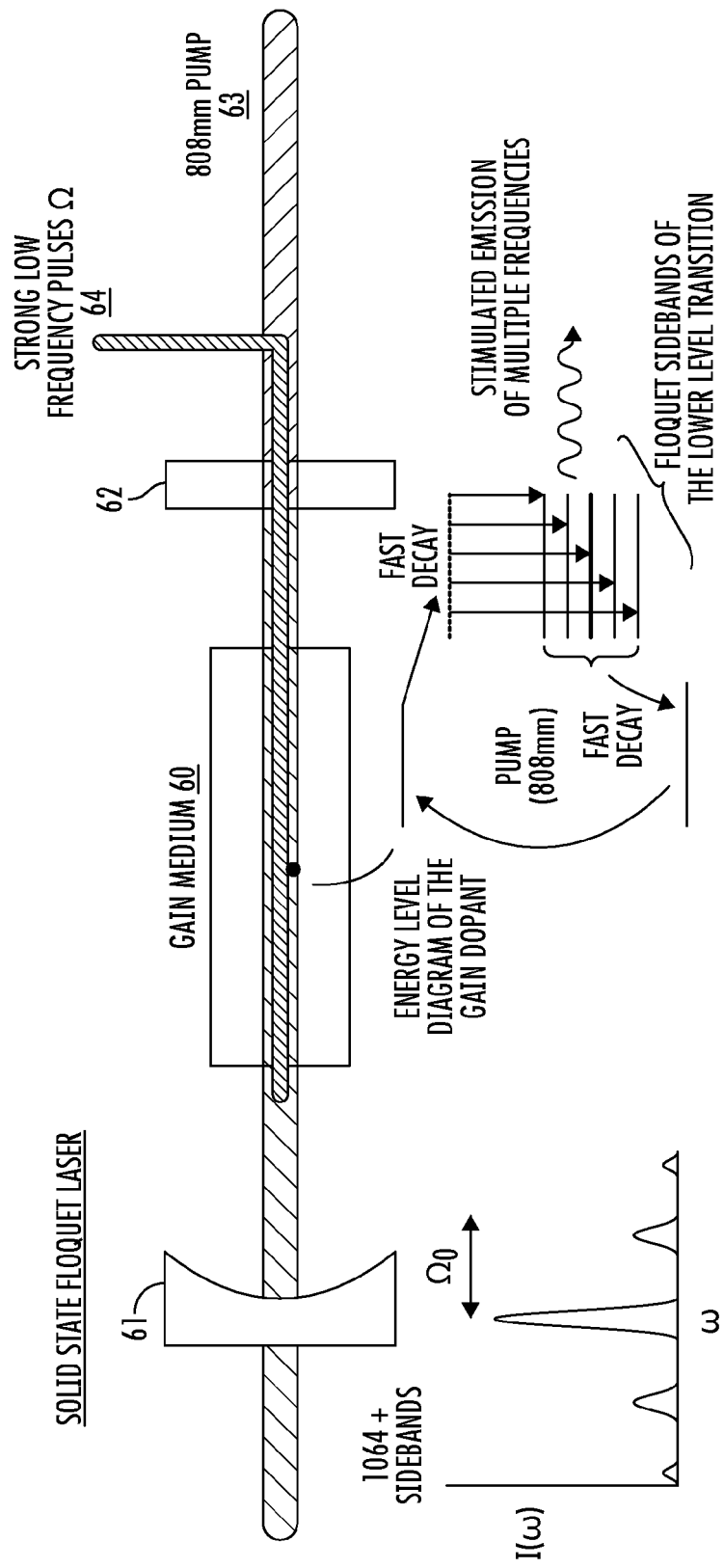
FIG. 6 shows a solid state Floquet laser according to one embodiment.

FIG. 6 shows one embodiment of a Floquet laser based on using strongly modulated solid state gain media as a Floquet gain medium. The figure depicts a typical solid state laser setup which comprises a solid state gain crystal, which is the gain medium 60, placed in between two partially reflecting mirrors 61, 62. The gain medium 60 is pumped to inversion with an external laser 63. The gain medium 60 is also strongly modulated in time with an additional strong laser field 64, creating a Floquet gain medium. Once above threshold, the Floquet gain medium will lase into one or more frequencies of the cavity, based on how the system has been constructed.

High Frequency Lasers Based on High Harmonic Generation (HHG) Gain Media

Floquet lasers may be configured to operate at UV-X-Ray frequency using a Floquet gain medium which is based on materials that undergo high harmonic generation. In high harmonic generation (HHG), some sample of material (usually a gas jet or solid) is irradiated with short and intense laser pulses of some driving frequency $\Omega_0$, which is often in the infrared range. The electric field strength of the pulses is sufficiently strong such that so-called nonperturbative nonlinearities are induced in the material, enabling the conversion of the input beam into many harmonics at frequencies $k\Omega_0$. Harmonic numbers of 100 or more are observed, and even 1000 or more harmonics may be achieved.

Studying HHG from a quantum mechanism perspective reveals that the generated harmonics can be described in terms of single-photon spontaneous emission events between Floquet quasi-energy levels of the driven system.

Generally speaking, transitions at exact harmonics occur due to spontaneous emission events between some Floquet state $\psi_\alpha$ and itself. However, it is also possible to have transitions which occur between two different Floquet states $\psi_\alpha \to \psi_\beta$, where the frequency of the emitted photon is $\in_{\alpha\beta}+k\Omega_0$, where $\in_{\alpha\beta}$ is a shift due to the quasi-energy difference between the Floquet levels. Transitions of this sort may be associated with hyper-Raman lines that have been observed in high harmonic generation systems. These are the transitions which can potentially be used to create a Floquet laser at EUV or X-ray frequencies. In order to achieve UV/X-ray lasing, very high incident field strengths are required for the Floquet drive, as is known from experimental HHG if very many harmonics are to be achieved. For example, if the driving wavelength is at 800 nm, then operating around the k=59th harmonic will enable emission at 13.5 nm, the wavelength used for EUV lithography. Intensities on the order of a few to hundreds of TW/cm$_2$ are required to enter into this regime.

Figure 16:
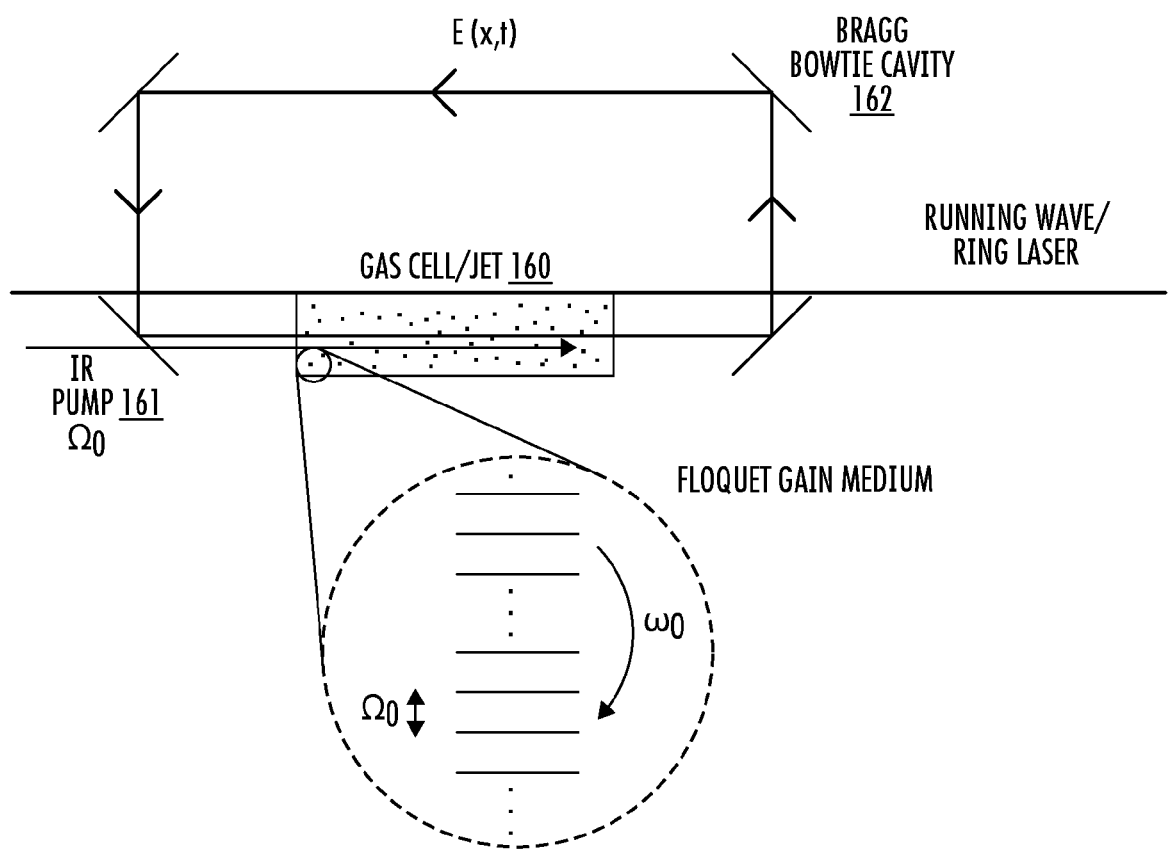
FIG. 16 shows a UV/X-ray laser based on high harmonic generation (HHG) media according to one embodiment.

FIG. 16 shows a high frequency (UV-X-ray) laser based on a strongly modulated gas as a Floquet gain medium. In this embodiment, the Floquet gain medium is a gas cell or jet 160 which is strongly modulated in time by a strong external laser field 161 (infrared at 800 nm, for example). Such systems are known to emit many harmonics of the driving field, resulting in a HHG media. This system is placed in a resonant cavity 162 which allows for spontaneously emitted high frequency radiation to re-interact with the system, providing gain. Such a resonant cavity 162 can potentially be constructed from Bragg reflectors, which exhibit relatively high reflectivity for low wavelength radiation. This device has the potential to act as a coherent monochromatic source of X-rays.

Use as a Single-Pass Amplifier

The high harmonic Floquet gain medium can be used as a single pass amplifier for radiation at potentially high frequencies. In this case, the gain medium is pumped and excited to establish inversion. From here, radiation at the desired frequency is passed into the Floquet gain medium, and an output beam with higher output power is collected on the output side.

Use in Resonant Operation with Cavity

It is also possible to operate a HHG Floquet gain medium in conjunction with an optical feedback mechanism for the output field, so that the gain medium will repeatedly amplify a signal through stimulated emission. In this case, an external seed is not necessarily required, as the process will self-seed through spontaneous emission.

One way to create a feedback mechanism is to build a cavity with mirrors which are partially reflective at the lasing frequency. For lasing frequencies in the EUV through X-ray range, Bragg mirror based reflectors can be used, although other configurations are also possible. In order for the feedback interaction to be effective, the mirrors may be between 108 and 99% reflective.

Semiconductor Floquet Laser

Figure 14:
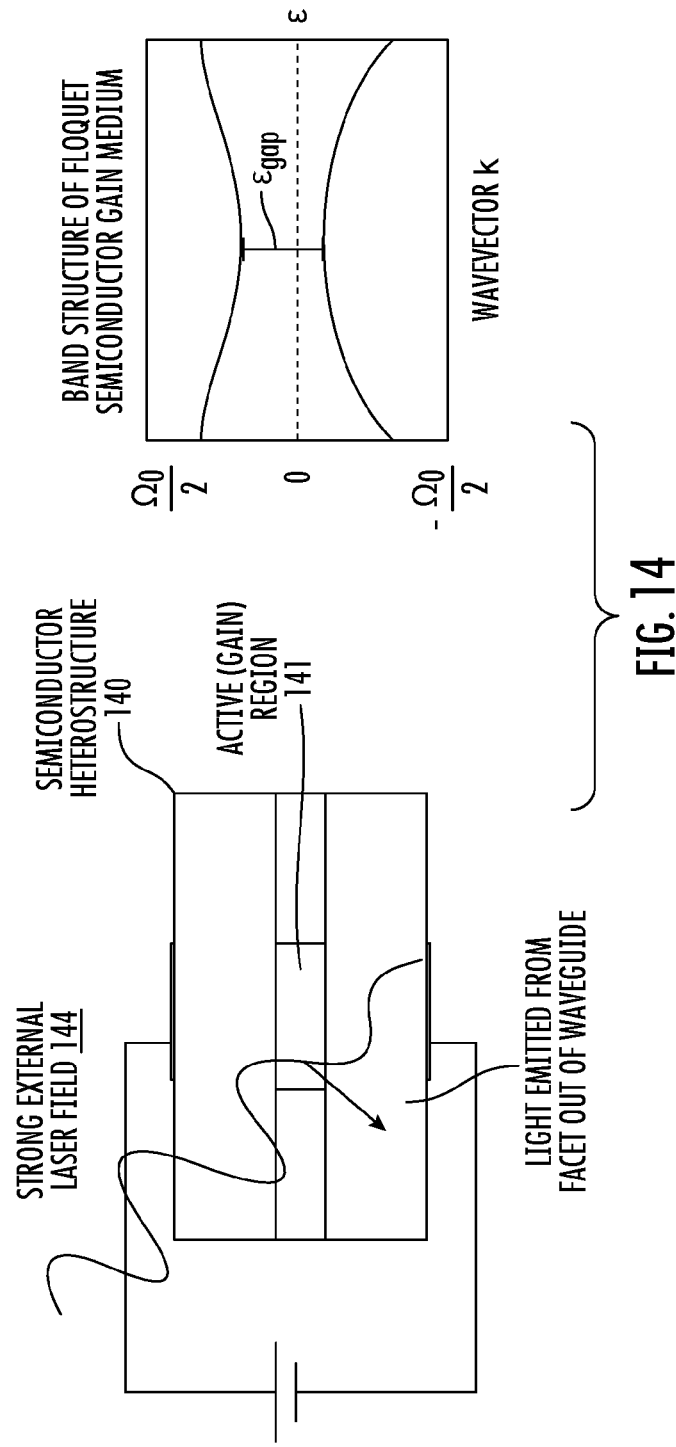
FIG. 14 shows a semiconductor Floquet laser according to one embodiment.

FIG. 14 shows a Floquet semiconductor laser according to one embodiment. The device comprises a semiconductor heterostructure 140 which comprises an active region 141 and a waveguide which acts as a cavity. The device is electrically pumped to a state of inversion. Then, the device is strongly modulated with an external laser field 144, which turns the semiconductor into a Floquet gain medium. On the right side of FIG. 14, the Floquet band structure of two of the bands of the semiconductor around the gamma point is shown. The y axis shows the quasi-energy of the electrons in each band, plotted as a function of the wavevector around the gamma point. When operated, the device may be able to lase into any of the configurations summarized in FIGS. 3A-3F.

Floquet Laser Based on YAG

The following describes in detail the calculations of the steady state behavior of a Floquet laser based on the solid state gain medium Nd:YAG. It is assumed that a modulation with an external laser field is induced so that the Nd:YAG quasi-energy levels follow the model proposed described above. In this embodiment, $\omega_0$ corresponds to the frequency of the 1064 nm transition in Nd:YAG. For this gain medium, the excited state decay rate is $\gamma_\parallel = 1/(230 \ \mu s)$, while the dephasing rate is $\gamma_\perp = 10^9/s$. Note that these parameters are chosen to be representative examples, but may be slightly modified in the presence of the strong Floquet drive. These parameters will also be different for other gain media. Additionally, it is assumed that the modulation is performed at a 10 micron wavelength, such as that output by a $CO_2$ laser. With that in mind, Floquet energy diagrams and the steady state behavior for several different amplitudes of modulation are shown, ranging from weak, to strong, to very strong.

Weak Modulation: $\eta = 0.1$

Figure 7:
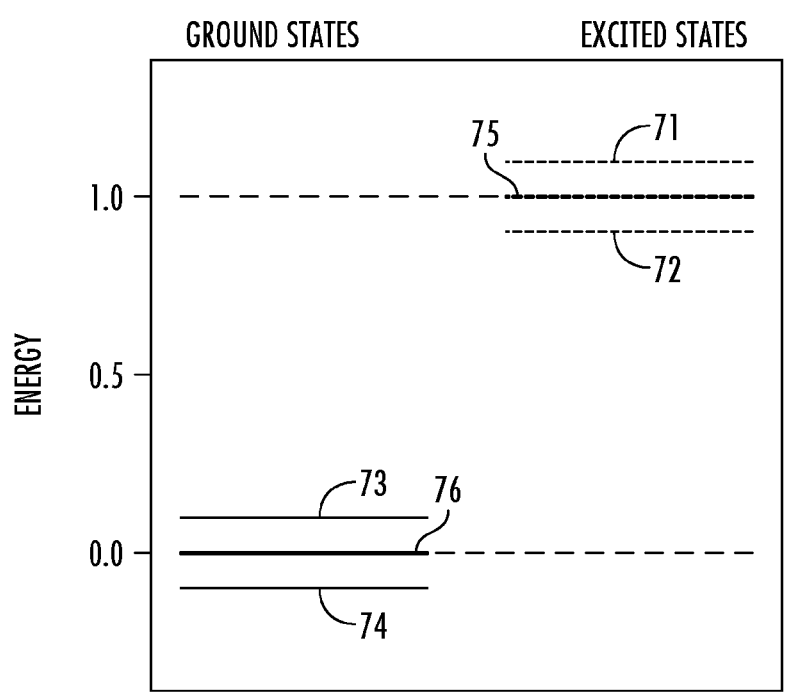
FIG. 7 shows the excited and ground state with the sidebands caused by the Floquet mechanism where η=0.1.

FIG. 7 shows the zeroth order transitions 75, 76 and faint sidebands 71, 72, 73, 74 at the 10 micron frequency. In FIG. 7, the y-axis corresponds to the energy of various Floquet levels given in units of the unperturbed resonance frequency, $\omega_0$. FIG. 8 shows the steady state photon numbers as a function of pump rate in the case that 1, 3, and 5 modes are included in the lasing process. The thresholds are very similar for all of these cases, since the sideband modes are only able to laser very weakly, thus not substantially affecting the inversion. Moreover, the number of photons in each of the sidebands decreases rapidly with each sideband. In this case, with a cavity loss rate of $K=10^7/sec$ for each of the modes, this corresponds to an output laser power on the order of a watt for the zeroth order mode, a milliwatt for the first Floquet band, and a microwatt for the second Floquet band. Note that a pump rate of $\Lambda = 2 \times 10^{19}/sec$ is used for the spectrum plots in the bottom row. This corresponds to being roughly 10× above threshold.

Strong Modulation: $\eta = 1$

Figure 9:
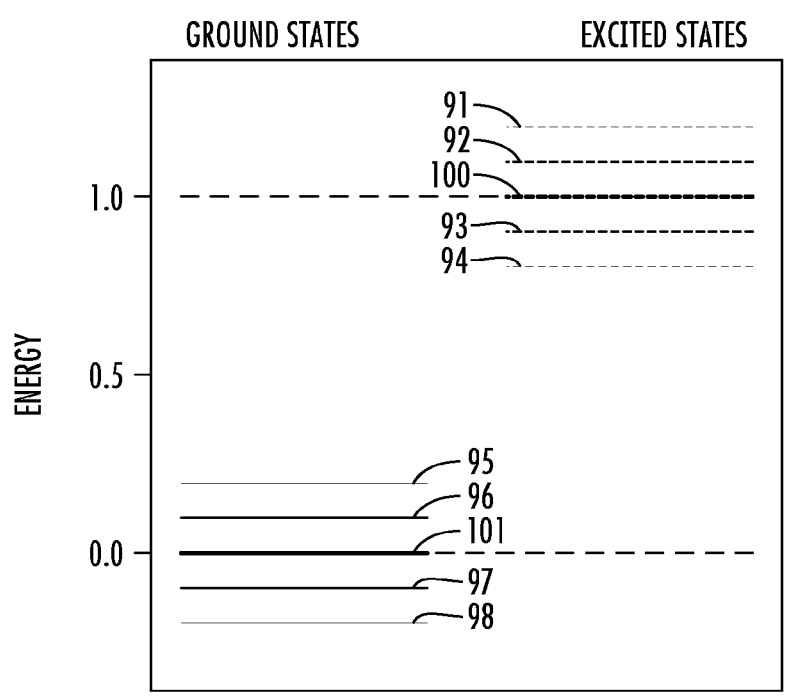
FIG. 9 shows the excited and ground state with the sidebands caused by the Floquet mechanism where η=1.0.

FIG. 9 shows the zeroth order transitions 100, 101 and the sidebands 91, 92, 93, 94, 95, 96, 97, 98 at the 10 micron frequency. In FIG. 9, the y-axis corresponds to the energy of various Floquet levels given in units of the unperturbed resonance frequency, $\omega_0$. FIG. 10 shows the steady state photon numbers as a function of pump rate in the case that 1, 3, and 5 modes are included in the lasing process. In this case, the sidebands make substantial contributions, though still strictly decrease with sideband number away from the original transition.

The plots of FIG. 10 are similar to those in FIG. 8, for stronger modulation parameters. In particular, this is the time-modulation equivalent of the "ultrastrong coupling regime" in which the time dependence is beginning to fundamentally alter the structure of the gain medium. In this case, note that the threshold goes down significantly when the second pair of modes is allowed to lase. This is because of the substantial stimulated emission rate from the sideband contribution which now plays an important role in determining the saturated inversion. Due to this, in the 3 mode configuration, the first pair of sidebands can lase with a steady state photon number which is only around a factor of two less than that of the fundamental mode. This means that substantial output power goes into the sidebands. Additionally, in the 5 mode case, the second pair of sidebands have steady state photon numbers which are on the order of a factor of 10 less than the fundamental. This is substantially less than in the perturbative regime $\eta = 0.1$ which was shown above. Note that the photon numbers in the bottom plots is graphed using a linear scale.

Extremely Strong Modulation: $\eta = 2.0$

Figure 11:
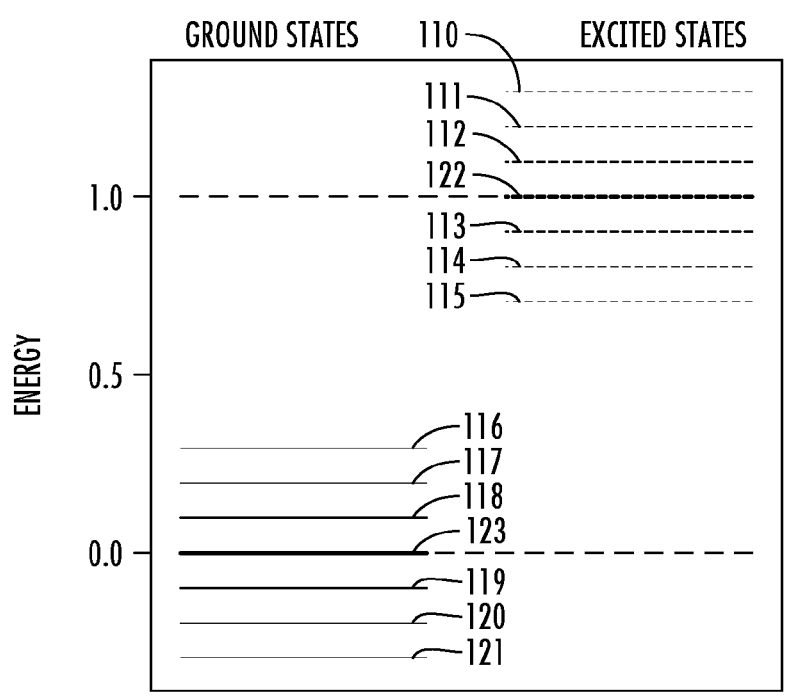
FIG. 11 shows the excited and ground state with the sidebands caused by the Floquet mechanism where η=2.0.

In FIG. 11, the y-axis corresponds to the energy of various Floquet levels given in units of the unperturbed resonance frequency, $\omega_0$. FIG. 12 shows the steady state photon numbers as a function of pump rate in the case that 1, 3, and 5 modes are included in the lasing process. As shown in FIG. 11, the sidebands 110, 111, 112, 113, 114, 115, 116, 117, 118, 119 begin to dominate. In particular, it can be seen that the first sideband 112, 113, 118, 119 actually provides a larger contribution than the zeroth order transition 122, 123.

The plots of FIG. 12 are similar to those in FIG. 8, for extremely strong modulation parameters. The pump rate in this embodiment has been increased to $\Lambda = 5 \times 10^{19}/sec$ in order to let the zeroth order mode come above threshold when it is the only mode allowed to lase. For the single mode case, it can be seen that the threshold is comparatively high with respect to the multi-mode cases, since the inversion saturation takes its primary contribution from the sidebands. This represents an entirely nonperturbative regime in which the first sidebands actually lase more strongly than the zeroth order mode. Note that the photon numbers in the bottom plots is graphed using a linear scale.

In this embodiment, assuming the cavity leakage rate of $K=10^7/sec$, the total output power of the laser at different harmonics is macroscopically large. For example, an intracavity photon number of $10^{12}$ corresponds to an output power of 1.8 Watts at 1064 nm. Note that for the parameters assumed, the wavelengths of light output in harmonics k={−2, −1,0,1,2} are respectively $\lambda_k$={1331, 1183, 1064, 968, 887} nm.

Figure 13:
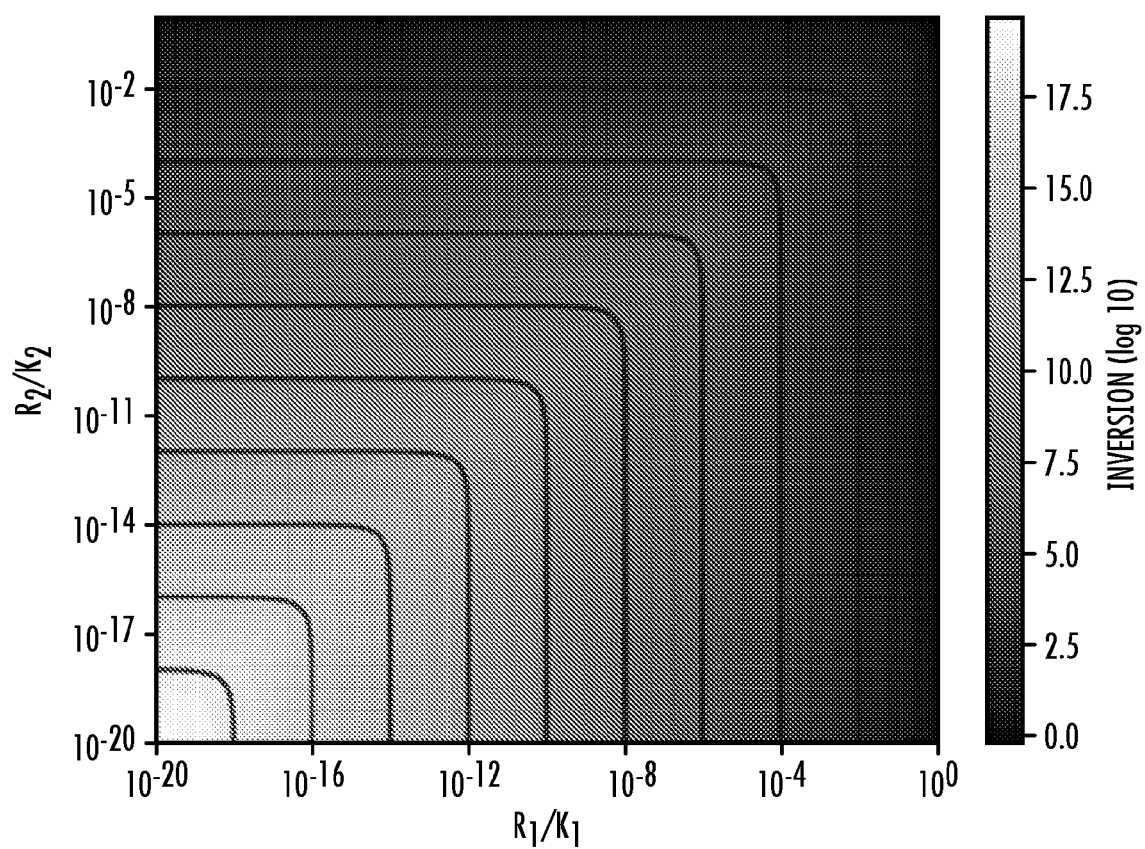
FIG. 13 shows a plot of two mode saturated inversion.

FIG. 13 shows the saturated inversion as a function of the spontaneous emission to loss ratios $R_l/K_l$ for two modes (l=1, 2) for a two-mode Floquet laser. This figure indicates how the steady state inversion behaves for a two-mode laser. Floquet laser. In particular, the highest inversion is achieved for low spontaneous emission rates and high losses. Additionally, this emission to loss ratio for both of the modes impacts the inversion in a symmetrical way, with the maximal inversion obtained when the spontaneous emission to loss rate is equal for both modes.

Inversionless Operation

The present system allows for inversionless operation.

FIG. 17 shown the Floquet quasi-energy levels of a driven two-level system for a modulation $\eta=\delta\omega/\omega_0$=2.2. In this configuration, the modulation is very strong, such that many harmonics of the driving frequency become involved. An electron which is in the Floquet ground state 170 can make transitions between quasi-energy levels of the Floquet excited state 171. Transitions to a higher quasi-energy level can be made via the absorption of a photon from the environment, while transitions to a lower quasi-energy level can be made via the spontaneous or stimulated emission of a photon. The right panel shows these resonant transitions in terms of the imaginary part of the polarizability of the two-level system. Imaginary values which are positive correspond to the absorptive transitions, while imaginary values which are negative correspond to the emissive transitions. The absorptive transitions can be used as single or multimode Floquet laser modes in the configuration where the population must be inverted by an external pumping mechanism which populates the excited Floquet state. The emissive transitions can be used in the "inversionless" Floquet lasing configuration, which relies on stimulated emission transitions from the thermodynamic ground state of the system. This is further shown in FIG. 18.

Figure 18:
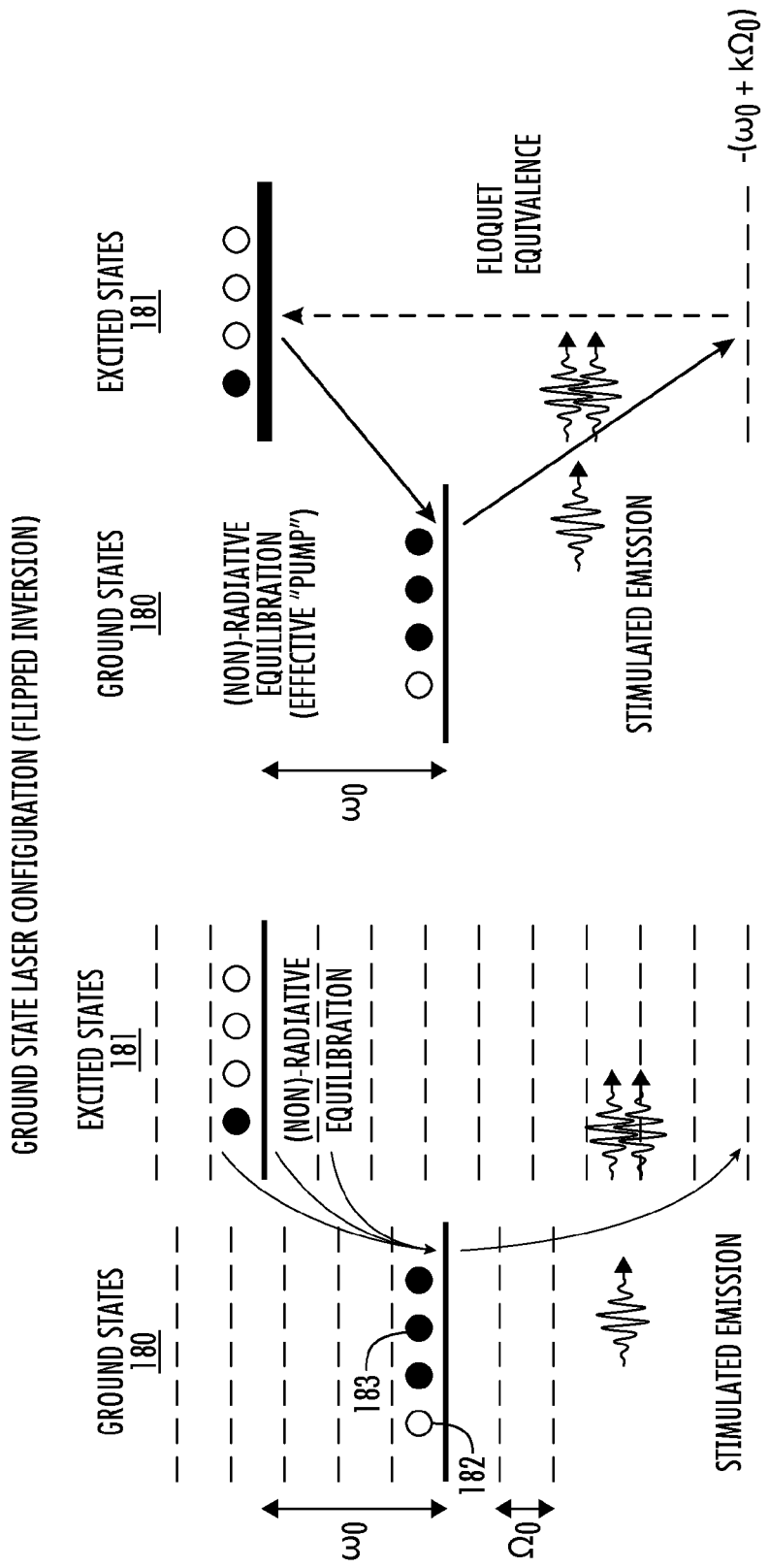

FIG. 18 depicts further details about the "inversionless" Floquet lasing mechanism depicted here for a two-level system. The left panel depicts the quasi-energy levels of a modulated two level system. The circles represent electron populations within the ensemble of potentially many atoms. Open circles 182 represent absent electrons, whereas filled circles 183 represent occupation of a level by an electron. Importantly, the configuration depicted here shows that the Floquet ground state 180 is more populated than the Floquet excited state 181. This is due to thermal equilibration within the Floquet system, which can occur due to a combination of radiative or non-radiative processes of transitions between the two states. $\Gamma_e$ is defined as the total rate of transition between the Floquet excited state and the Floquet ground state, and $\Gamma_g$ is defined as the total rate of transition between the Floquet ground state and the Floquet excited state. Then, the equilibrium inversion is given by $d_0=(\Gamma_g-\Gamma_e)/(\Gamma_g+\Gamma_e)$. Note that in the absence of any external pumping mechanism to invert population, the inversion is necessarily negative ($d_0$<0), since $\Gamma_e>\Gamma_g$ by definition of the Floquet ground and excited states. This Floquet gain medium can impart gain onto a passing field via stimulated emission at transitions between the Floquet ground state and the Floquet excited state. This is the key mechanism of stimulated emission which is not allowed in a traditional laser with a time-independent Hamiltonian. Importantly, once the stimulated emission has occurred, the atomic system is the Floquet excited state, which will then decay by thermalization back down to the Floquet ground state at rate $\Gamma_e$. The system is thus brought thermally back down to the initial state, and can repeat the process to produce further stimulated emission.

A simplified version of this picture is depicted in the right panel in order to make a comparison to a "normal" laser pumping scheme. One of the key elements here is the Floquet equivalence of all of the Floquet quasi-energy levels. For Floquet energy level diagrams, occupation numbers are not assigned to each of the Floquet quasi-levels individually, but rather an occupation number to the whole Floquet state (of which there are two in this example system). This means that once the ground state transitions to the excited state via spontaneous or stimulated emission, it can then transition back to the ground state immediately via a radiative or non-radiative decay process encompassed in the rate $\Gamma_e$. In a normal laser, there is some external pump which inverts the population at a rate A. In this case, the effective pumping rate is given by the difference of decay rates $\Lambda_{eff}=\Gamma_g-\Gamma_e$. Note that this pump rate has been defined such that $\Lambda_{eff}$<0. This represents the fact that the effective pumping mechanism actually causes the inversion to be negative instead of positive, as in a traditional laser. For a laser in which the polarization decay rate is fast compared to the cavity and inversion lifetimes in the system, the inversionless two-level laser can be described by the pair of rate equations:

$$\dot{n} = -(\kappa + R_{sp}D)n$$

$$\dot{D} = \Lambda_{eff} - \gamma_{\parallel}D + 2R_{sp}nD$$

In these equations, n is the photon number in the cavity, D is the inversion of the gain medium, $R_{sp}$ is the spontaneous emission rate, k is the cavity decay rate, $\gamma_{\parallel}$ is the inversion decay rate, and $\Lambda_{eff}$ is the effective pump rate which comes from decay from the excited to ground state.

This system and method have many advantages. There are many potential applications of a Floquet laser. These include:

Creation of single or multi-frequency lasers at high frequencies (UV-X-ray) where traditional gain media have historically not worked well. Examples of applications of such a device would include new sources for EUV lithography (at 13.5 nm), compact sources for X-ray nonlinear optics or spectroscopy and crystallography.

Creation of single or multi-frequency lasers at low frequencies (IR-THz) where traditional gain media are not able to cover the whole spectrum. Applications of such sources would include spectroscopy of vibrational transitions in molecules and other organic structures, as well as THz nonlinear optical experiments.

Ability to take a gain medium which can only operate at one frequency, and modify/tune its frequency of operation by changing the Floquet driving frequency.

Ability to take a material which does not operate well as a gain medium, and turn it into a viable gain medium by Floquet driving.

Ability to create lasing in the absence of traditional inversion. This may be particularly useful in situations where lasing is traditionally difficult to achieve due to the inability to create traditional inversion (due to fast population relaxation times, for example).

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A laser, comprising:
   a cavity;
   a gain medium disposed within the cavity; and
   a time varying field applied to the gain medium to transform the gain medium into a time varying gain medium; wherein the time varying field causes the time varying gain medium to provide gain at one or more frequencies that are not in a gain bandwidth of the gain medium and wherein the time varying field has a modulation frequency ($\Omega_0$) and a strength at the modulation frequency ($\delta\omega$), wherein a fractional modulation parameter ($\eta$) is defined as $\delta\omega/\Omega_0$.

2. The laser of claim 1, wherein the gain medium comprises a solid state gain medium.

3. The laser of claim 1, wherein the gain medium comprises one or more gasses.

4. The laser of claim 1, wherein the gain medium comprises a metal, an insulator, or a semiconductor.

5. The laser of claim 1, wherein the gain medium comprises a spin system.

6. The laser of claim 1, wherein the gain medium comprises a qubit or a superconducting circuit.

7. The laser of claim 1, wherein the gain medium comprises a free electron/ion system.

8. The laser of claim 1, wherein $\eta$ is less than 0.1.

9. The laser of claim 1, wherein $0.1 \leq \eta < 1$.

10. The laser of claim 1, wherein $\eta$ is greater than 1.

11. The laser of claim 1, wherein the time varying field comprises an RF field.

12. The laser of claim 1, wherein the time varying field comprises a pulsed laser.

13. The laser of claim 1, wherein the time varying field comprises a continuous wave monochromatic or multichromatic IR/optical laser field.

14. The laser of claim 1, wherein the time varying field comprises an electric field.

15. The laser of claim 1, wherein the time varying field is periodic.

16. The laser of claim 1, wherein the laser operates in an inversionless configuration, such that a pump source is not utilized.

17. The laser of claim 1, wherein the laser operates in an inversion configuration, and further comprising a pump source to create an inversion.

18. The laser of claim 17, wherein the time varying gain medium is a gas-based gain medium and the pump source comprises electrical discharge.

19. The laser of claim 17, wherein the time varying gain medium is a solid state gain medium and the pump source comprises flashlamp discharge or a second laser.

20. The laser of claim 17, wherein the time varying gain medium is a semiconductor gain medium and the pump source comprises an external current source.

21. The laser of claim 1, wherein the laser operates at microwave frequencies and wherein cavity comprises a closed or partially closed metallic structure.

22. The laser of claim 1, wherein the laser operates at optical or infrared frequencies and the wherein the cavity comprises two or more mirrors.

23. The laser of claim 1, wherein the laser operates at UV or X-ray frequencies and wherein the cavity comprises structures based on Bragg reflection.

* * * * *